United States Patent [19]
Dearth et al.

[11] Patent Number: 5,848,236
[45] Date of Patent: Dec. 8, 1998

[54] OBJECT-ORIENTED DEVELOPMENT FRAMEWORK FOR DISTRIBUTED HARDWARE SIMULATION

[75] Inventors: Glenn A. Dearth, Groton; Bennet H. Ih, Cambridge, both of Mass.

[73] Assignee: Sun Microsystems, Inc., Palo Alto, Calif.

[21] Appl. No.: 621,776

[22] Filed: Mar. 22, 1996

[51] Int. Cl.⁶ .................................................. G06F 9/455
[52] U.S. Cl. .............................. 395/183.09; 395/183.08; 395/500
[58] Field of Search .................. 395/183.09, 183.08, 395/500, 183.14, 183.03, 183.04, 183.06, 701, 704, 710; 364/232.3, 488, 578, 580

[56] References Cited

U.S. PATENT DOCUMENTS

| | | | |
|---|---|---|---|
| 5,337,262 | 8/1994 | Luthi et al. | 364/580 |
| 5,339,262 | 8/1994 | Rostoker et al. | 364/578 |
| 5,404,525 | 4/1995 | Endicott et al. | 395/702 |
| 5,557,774 | 9/1996 | Shimabukuro et al. | 395/500 |
| 5,594,741 | 1/1997 | Kinzelman et al. | 371/27 |

OTHER PUBLICATIONS

Kenneth E. Ayers, An Object–Oriented Logic Simulator, Dr. Dobb's Journal, v. 14, n. 12, pp. 1–9, Dec. 1989.

John G. Shea & Rammoham K. Ragade; Virtual Prototyping, Object–Oriented Modeling & Intelligent Knowledge Capture for System Design; IEEE, 1993; pp. 23–30.

She et al; Combining Object Oriented Modeling & Intelligent Knowledge Capture for Testbed Simulation of Real Time Systems; Conference Paper, Jan. 17–20/1993; pp. 61–66.

Carvalho et al; Object–Oriented Design of Microwave Cit Simulators;IEEE MIT–S Digest; 1993; pp. 1491–1494.

Nerson; Applying Object–Oriented Analysis & Design; Communications of The ACM, v. 35, N. 9; pp. 63–74; Sep. 1992.

*Primary Examiner*—Robert W. Beausoliel, Jr.
*Assistant Examiner*—Dieu-Minh Le
*Attorney, Agent, or Firm*—James D. Ivey

[57] ABSTRACT

A base test class is defined in an object-oriented computer program development environment and members of the base test class, i.e., test objects, represent individual test processes in a computer. The base test class defines a number of attributes and member functions which are inherited by test objects including a constructor member function which is performed when a test object is created. Creation of a test object performs substantially all that is required to implement interfaces and protocols (i) for interaction between the test object and simulation systems, (ii) for synchronization of processing of the test object with processing of other test objects and with simulation systems, and (iii) for reservation by the test object of devices of simulation systems. In addition, a base device class defines a number of attributes and member functions which are inherited by device objects. Device objects represent devices of simulation systems which interact with the test process. The base device class defines read and write member functions which invoke test member functions to transfer of data between the test object and a simulation system and a device constructor member function such that merely creating a device object automatically reserves the device represented by the device object to the test object within which the device object is created. In addition, by merely deleting the device object, reservation of the represented device is automatically released.

15 Claims, 15 Drawing Sheets

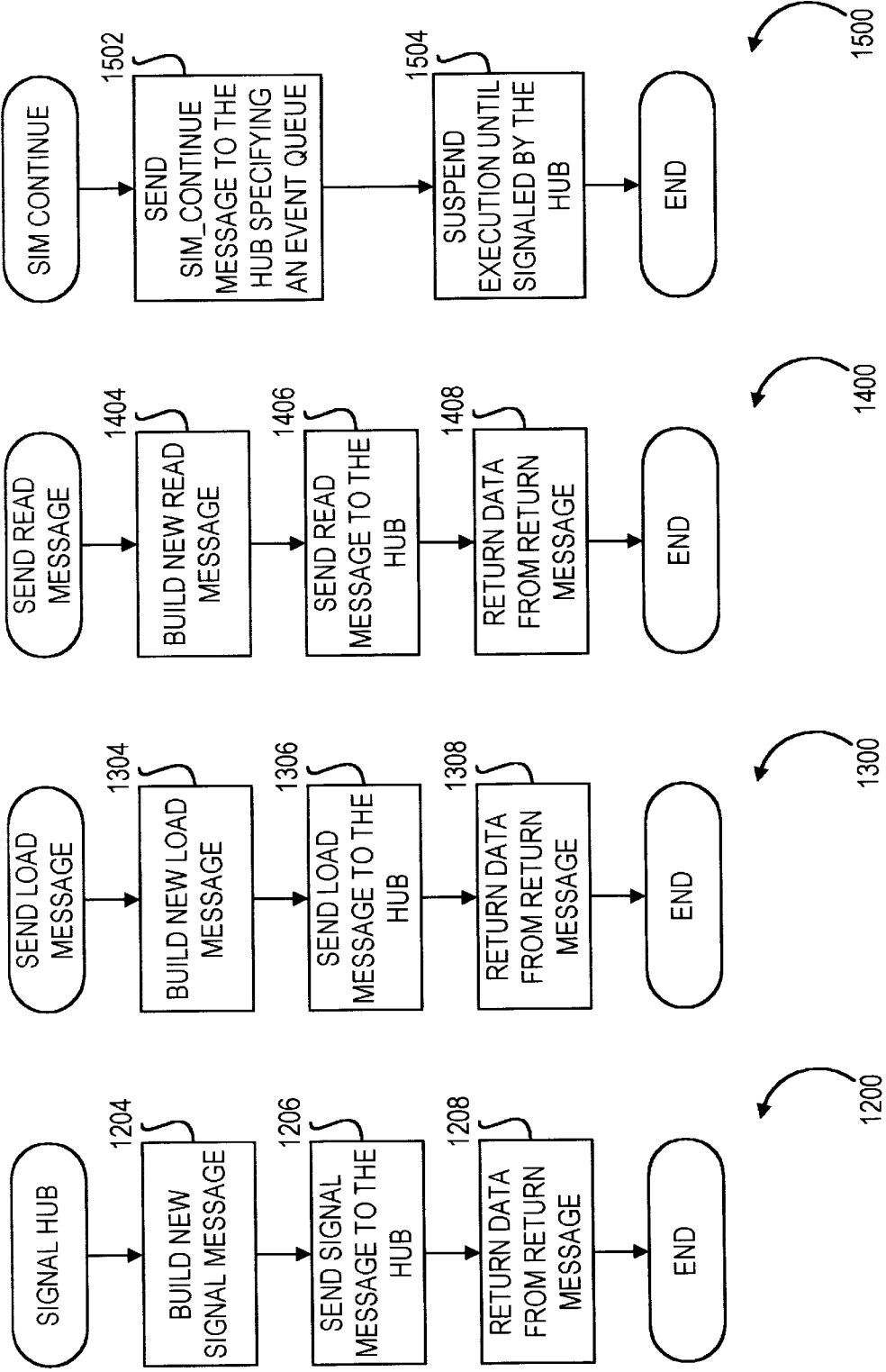

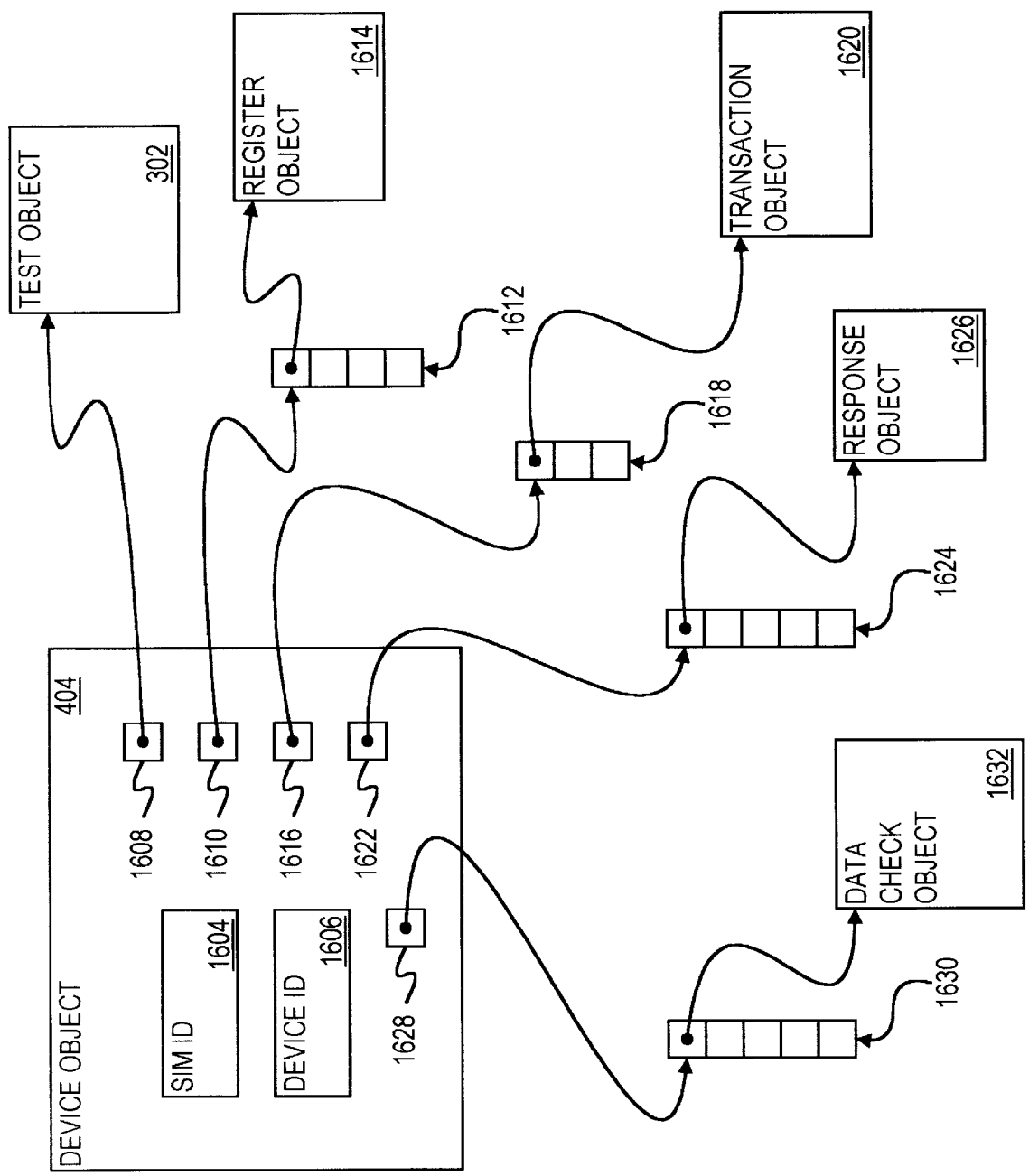

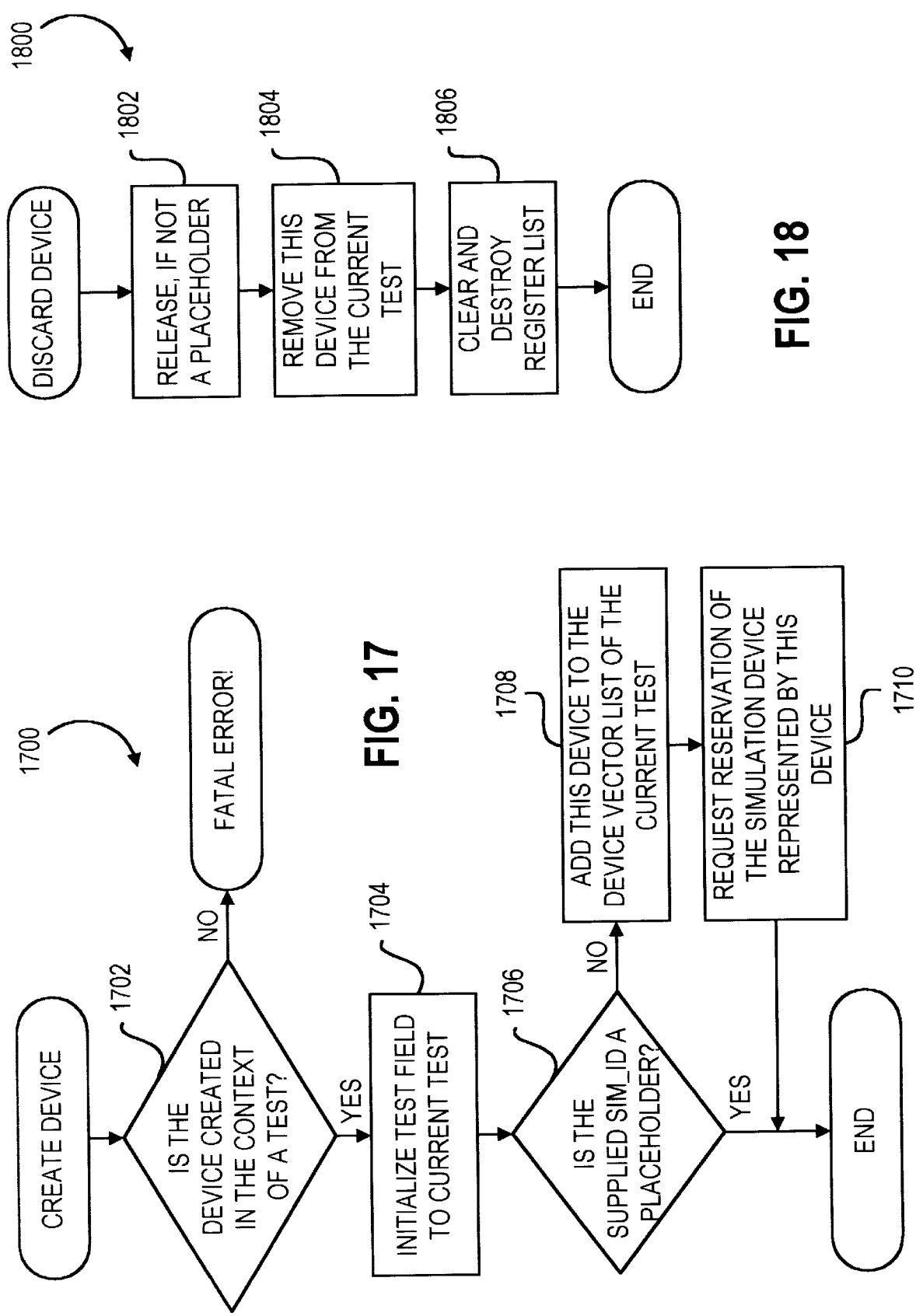

OBJECT-ORIENTED DEVELOPMENT FRAMEWORK FOR DISTRIBUTED HARDWARE SIMULATION

CROSS-REFERENCE TO RELATED APPLICATIONS

The following copending U.S. patent applications are related to the present disclosure and the disclosures thereof are incorporated herein by reference: (i) a copending U.S. patent application Ser. No. 08/620,439 and now U.S. Pat. No. 5,732,247 issued on Mar. 24, 1998 for "Interface for Interfacing Simulation Tests Written in a High-Level Programming Language to a Simulation Model" by Glenn A. Dearth, Paul M. Whittemore, David A. Medeiros, George R. Plouffe, Jr., and Bennet H. Ih filed on Mar. 22, 1996 (hereinafter the "Interface Application"), (ii) a copending U.S. patent application Ser. No. 08/621,775 for "Virtual Bus for Distributed Hardware Simulation" by Glenn A. Dearth and Paul M. Whittemore filed on Mar. 22, 1996 (hereinafter the "Virtual Bus Application"), (iii) a copending U.S. patent application Ser. No 08/621,777 for "Deadlock Avoidance Mechanism for Virtual Bus Distributed Hardware Simulation" by Glenn A. Dearth filed on Mar. 22, 1996 (hereinafter the "Deadlock Avoidance Application") (iv) a copending U.S. patent application Ser. No. 08/621,818 and now U.S. Pat. No. 5,812,824 issued on Sep. 22, 1998 for "Device Reservation Mechanism for Distributed Hardware Simulation" by Glenn A. Dearth filed on Mar. 22, 1996 (hereinafter the "Reservation Application"), and (v) a copending U.S. patent application Ser. No. 08/621,816 for "Synchronization Mechanism for Distributed Hardware Simulation" by Paul M. Whittemore and Glenn A. Dearth filed on Mar. 22, 1996 (hereinafter the "Synchronization Application").

FIELD OF THE INVENTION

The present invention relates to computer simulation of electronic circuitry and, in particular, to a method and apparatus for providing particularly convenient development tools for developing tests for simulation of complex circuitry using models which can be distributed over a computer network.

BACKGROUND OF THE INVENTION

In designing complex circuitry such as application-specific integrated circuits ("ASICs"), the designed logic of such circuitry is typically simulated in a computer using data and computer programs to thereby test the viability and accurate performance of the designed logic. By doing so, design flaws can be detected prior to expending the engineering and financial resources and time required to physically build the circuitry. To simulate circuitry using data and computer programs, the circuitry is described in a hardware description language ("HDL") to form a model. One example of an HDL is the Verilog HDL processed by the Cadence Verilog hardware simulator available from Cadence Design Systems, Inc. of San Jose, Calif. The HDL model of a circuit typically includes a description of components of the state of the circuit and a description of the behavior of the circuit. The behavior of the circuit generally includes interrelationships between various components of the state of the circuit.

A hardware simulator then uses the HDL model of the circuitry to simulate the circuitry. The hardware simulator is a computer process which accepts data defining simulated signals to be placed on certain parts of the simulated circuit and then changes the state of the circuit in accordance with the simulated signals. The certain parts of the circuit include, for example, terminals, lines, or registers of the simulated circuit.

Circuitry which is simulated in this manner is becoming increasingly complex; therefore, simulation of such circuitry on a single computer processor is becoming less feasible. Specifically, simulations of particularly complex circuits require intolerable amounts of time and computer resources to execute. The Interface Application describes a mechanism by which a complex circuit is divided into multiple circuit parts and by which the circuit parts are simulated by individual models which can execute on multiple constituent computers of a computer network. The Virtual Bus Application and Deadlock Avoidance Application describe a particularly efficient mechanism by which the individual models of the circuit parts can be widely distributed among constituent computers of a computer network and still collectively efficiently simulate the behavior of a complex circuit.

In addition, the mechanism described in the Interface Application permits multiple tests of the simulated circuit to execute concurrently. A test of a simulated circuit is a series of computer instructions and data which collectively define simulated signals to be placed at particular locations within the simulated circuit and simulated signals to be sampled at other particular locations within the simulated circuit. For example, a test can include computer instructions which direct (i) that a specific simulated signal is stored within a specific register of the simulated circuit, (ii) that the circuit is simulated for a number of cycles of a simulated clock signal, and (iii) that a resulting simulated signal is retrieved from a second register of the simulated circuit.

The Interface Application describes an interface between such tests and individual models which permits development of such tests by test design engineers using a conventional, high-level computer instruction language, such as the C computer instruction language or the C++ computer instruction language. As a result, test design engineers can develop tests using sophisticated and versatile mechanisms provided by such computer instruction languages and need not master specific HDLs to develop and implement complex tests of simulated circuitry. However, the interface mechanism described in the Interface Application specifies interaction between various components of tests and simulation systems which must generally be implemented by any test developed and implemented by a test design engineer.

In addition, the Reservation Application describes a mechanism by which competing requests for exclusive access to a device or resource of the simulated circuit by multiple, concurrently executing tests are arbitrated. Such arbitration generally requires that a test behave in a particular manner to implement a device reservation protocol. Specifically, once a test has reserved one or more devices, the test must generally relinquish all device reservations before requesting further device reservations. Furthermore, the Synchronization Application defines a synchronization mechanism which uses a synchronization interaction protocol which must be accurately implemented by each test.

Thus, while the above-referenced U.S. Patent Applications describe mechanisms which represent a significant improvement over conventional interfaces between tests and simulation systems, test design engineers who develop and implement tests in accordance with the above-referenced U.S. Patent Applications must spend an appreciable amount of time and attention to ensure that such tests faithfully implement the described interfaces and protocols.

In addition, a verification engineer who implements transactors through which tests interact with simulation systems must generally expend significant amounts of time and effort to implement such transactors. A transactor generally simulates the behavior of circuitry coupled to the circuitry whose design and implementation are evaluated through simulation in the simulation systems described in the referenced U.S. Patent Applications. The circuitry whose design and implementation are evaluated through simulation in the simulation systems described in the referenced U.S. Patent Applications is generally referred to as the circuitry under test. A transactor can simulate, for example, a magnetic disk drive which is coupled to a PCI bus of a mother board which is the circuitry under test.

It is generally preferable that the portions of the transactors which interact directly with circuitry under test are simulated in a hardware verification environment such as the Cadence Verilog hardware simulator identified above since such hardware verification environments are specifically designed to simulate rather accurately circuit components of actual circuits specified in HDL and electrical signals received by and generated by such circuits. However, portions of transactors which do not interact directly with the circuitry under test can be rather complex and are relatively difficult to implement in HDL. The Interface Application describes an interface in which components of a simulation can be implemented in a high level language and can interact with other components of the simulation which are implemented in HDL. Portions of a transactor which do not interact directly the circuitry under test can be simulated with course detail, i.e., not specifying each physical component of the transactor but instead specifying the behavior of the transactor in the constructs of a more high level language such as the C++ computer instruction language. Specifying portions of the transactor in such a high level language, generally using complex data structures for example, significantly simplifies the task of the verification engineer in implementing the transactor since HDL does not generally provide for complex data structures and processing of such complex data structures. However simplified the task of the verification engineer may be as a result of the Interface Application, the task is still a formidable one.

What is needed is a test development mechanism which assists a test design engineer in efficiently developing and implementing tests which faithfully implement the described protocols.

SUMMARY OF THE INVENTION

In accordance with the present invention, a base test class is defined in an object-oriented computer program development environment and members of the base test class, i.e., test objects, represent individual test processes in a computer. The base test class defines a number of attributes and member functions which are inherited by test objects. The base test class defines a constructor member function which is performed when a test object is created. The constructor member function defined by the base test class includes computer instructions, execution of which in creating a test object performs substantially all that is required to implement interfaces and protocols (i) for interaction between the test object and simulation systems, (ii) for synchronization of processing of the test object with processing of other test objects and with simulation systems, and (iii) for reservation by the test object of devices of simulation systems. The base test class also defines member functions which include computer instructions, execution of which transfer messages between the test object and a hub through which a simulation involving a number of simulation systems and tests. In one embodiment, substantially all interaction between the test process and the hub is processed in the context of a test object as defined by the base test class.

In addition, a base device class is defined and itself defines a number of attributes and member functions which are inherited by device objects. Device objects represent devices of simulation systems which interact with the test process. To direct a test process to interact with devices of a simulation system, device objects of the base device class or a subclass thereof are created and data is written or retrieved through the device object by directing the device object to perform a read or write member function as defined by the base device class or a subclass thereof The base device class defines read and write member functions which direct a test object to perform test member functions which effect transfer of data between the test object and a simulation system.

The base device class defines a device constructor member function which is executed for each device object created in the context of the base device class or a subclass thereof The device constructor member function includes computer instructions, execution of which causes a test object to request from the hub reservation of, and therefore exclusive access to, the device represented by the created device object. Reservation of the device is released upon execution of a device destructor member function which is defined by the base device class and which is executed when the device object is deleted. Thus, by merely creating a device object, the device represented by the device object is automatically reserved to the test object providing the context within which the device object is created. In addition, by merely deleting the device object, reservation of the represented device is automatically released. As a result, the device reservation mechanism by which competing access to a device is arbitrated is properly implemented by a test developed and implemented by a test design engineer without requiring additional effort by the test design engineer.

BRIEF DESCRIPTION OF THE DRAWINGS

FIGS. 9–15 are logic flow diagrams of the processing of the test object of FIG. 3.

FIG. 16 is a block diagram of a device object in accordance with the present invention.

FIGS. 17 and 18 are logic flow diagrams of the processing of the device object of FIG. 16.

DETAILED DESCRIPTION

In accordance with the present invention, an object-oriented framework is provided in which essential behavior of tests and devices are defined in base test and base device classes, respectively. Changes in the behavior of a test or a device are implemented by specification of subclasses of the bast test class and the base device class, respectively, such that attributes and member functions of a test or device can be inherited from the base test class or the base device class, respectively. Thus, for example, two devices which differ in but a few ways can be instances of respective device classes which are subclasses of the base device class. The respective device classes can specify the few differences between the attributes and member functions of the devices and those of the base device class and can inherit all other attributes and member functions of the base device class. Thus, specification of the structure and behavior of a device is reduced to specifying only the differences in such structure and behavior from those of an instance of the base device class. In short, all of the benefits of developing systems in an object-oriented programming environment can be used in developing tests and transactors, while still using a conventional hardware verification environment such as the Cadence Verilog hardware simulator identified above to simulate accurately in fine detail components of transactors and the circuitry under test.

Hardware Operating Environment

Figure 1:
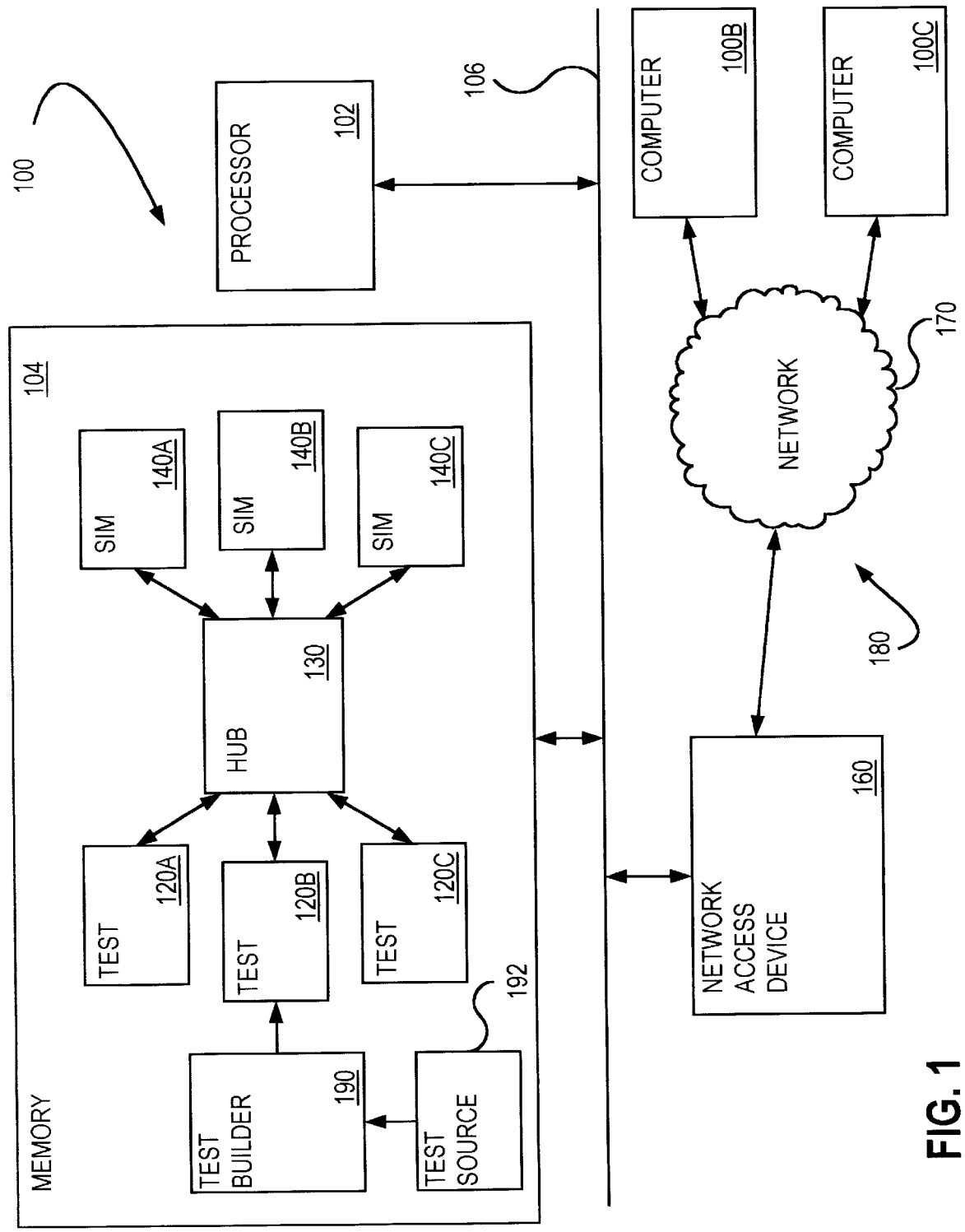
FIG. 1 is a block diagram of a computer network and a distributed simulation which includes a hub, a number of simulation systems which collectively simulate a circuit, and a number of tests which control the simulation of the simulated circuit.

To facilitate an appreciation of the present invention, the operating environment of the described embodiment is described briefly. FIG. 1 shows computers 100, 100B, and 100C connected to one another through a network 170 to form a computer network 180. Each of computers 100, 100B, and 100C are directly analogous to one another, and the following description of computer 100 is therefore equally applicable to computers 100B–C, except as otherwise noted.

Computer 100 includes a processor 102 which fetches computer instructions from a memory 104 through a bus 106 and executes those computer instructions. In executing computer instructions fetched from memory 104, processor 102 can retrieve data from or write data to memory 104, display information on one or more computer display devices (not shown), receive command signals from one or more user-input devices (not shown), or transfer data to computer 100B or computer 100C through network 170. Processor 102 can be, for example, any of the SPARC processors available from Sun Microsystems, Inc. of Mountain View, Calif. Memory 104 can include any type of computer memory including, without limitation, randomly accessible memory (RAM), read-only memory (ROM), and storage devices which include magnetic and optical storage media such as magnetic or optical disks. Computer 100 can be, for example, any of the SPARCstation workstation computer systems available from Sun Microsystems, Inc. of Mountain View, Calif.

Computer 100 also includes a network access device 160, through which computer 100 is coupled to network 170. Network access device 160, in accordance with control signals received from processor 102, cooperates with a network access device (not shown) of computer 100B or computer 100C to transfer data through network 170. The transfer of data between network access devices of computers 100, 100B, and 100C is conventional and well-known. Network access device 160 can be generally any circuitry which is used to transfer data between computer 100 and network 170 and can be, for example, an Ethernet controller chip or a modem.

Sun, Sun Microsystems, and the Sun Logo are trademarks or registered trademarks of Sun Microsystems, Inc. in the United States and other countries. All SPARC trademarks are used under license and are trademarks of SPARC International, Inc. in the United States and other countries. Products bearing SPARC trademarks are based upon an architecture developed by Sun Microsystems, Inc.

The Distributed Simulation Environment

Tests 120A–C, hub 130, and simulation systems 140A–C are computer processes executing in processor 102 from memory 104. Tests 120A–C and simulation systems 140A–C are described more completely in the Interface Application and that description is incorporated herein in its entirety by reference. Through hub 130, each of a number of tests interacts with any of a number of simulation systems to simulate multiple, concurrent transactions with a simulated circuit. The number of tests includes tests 120A–C and other tests which are directly analogous to tests 120A–C which execute within computers 100 and 100B–C. Similarly, the number of simulation systems includes simulation systems 140A–C and other simulation systems which are directly analogous to simulation systems 140A–C which execute within computers 100 and 100B–C. Only one hub can control transactions between the tests and simulation systems; therefore, no hubs which are analogous to hub 130 execute within either of computers 100B–C. While hub 130 is shown in FIG. 1 to be executing in a computer in which a number of tests and simulation systems execute, it should be noted that each of the processes shown to be executing in computer 100 can be distributed to other computers of computer network 180. For example, hub 130 can execute in a computer of computer network 180 in which no tests or simulation systems execute. Similarly, a test can execute in a computer in which neither hub 130 nor any simulation systems execute, and a simulation system can execute in a computer in which neither hub 130 nor any test execute.

Development of a Test

Test builder 190 is a computer process executing within computer 100 from memory 104 and converts a test source 192 to a test, e.g., test 120B. Test source 192 is a computer program which defines test 120B and which is configured by a test design engineer using conventional computer program development tools, such as the well-known "vi" editor of the well-known UNIX operating system. Computer programs and computer processes, and the relationship therebetween, are well-known but are described briefly for completeness.

A computer program is a series of computer instructions and data which, when executed within a computer system, perform a task. Execution of a computer program is a computer process, and the computer program defines the computer process. A single computer program can be executed any number of times, and each execution is a different computer process. In addition to the computer instructions and data of a defining computer program, a computer process includes data specifying an execution state of the computer process, including information identifying the computer instruction which is currently being executed, the computer instruction which is to be executed next, and a stack which is used to save previous computer process states for later restoration.

Test source 192 is a computer program which defines test 120B in source code form. Source code is a form of expression of computer instructions and/or data which is generally intelligible to a human being and in which computer instructions and/or data are expressed as collections of alphanumeric characters. Object code is a form of expression of computer instructions and/or data which is generally capable of being processed by a computer processor such as processor 102. The computer instructions and data of a computer process are generally expressed in object code form. Test builder 190 constructs test 120B from test source 192.

Figure 2:
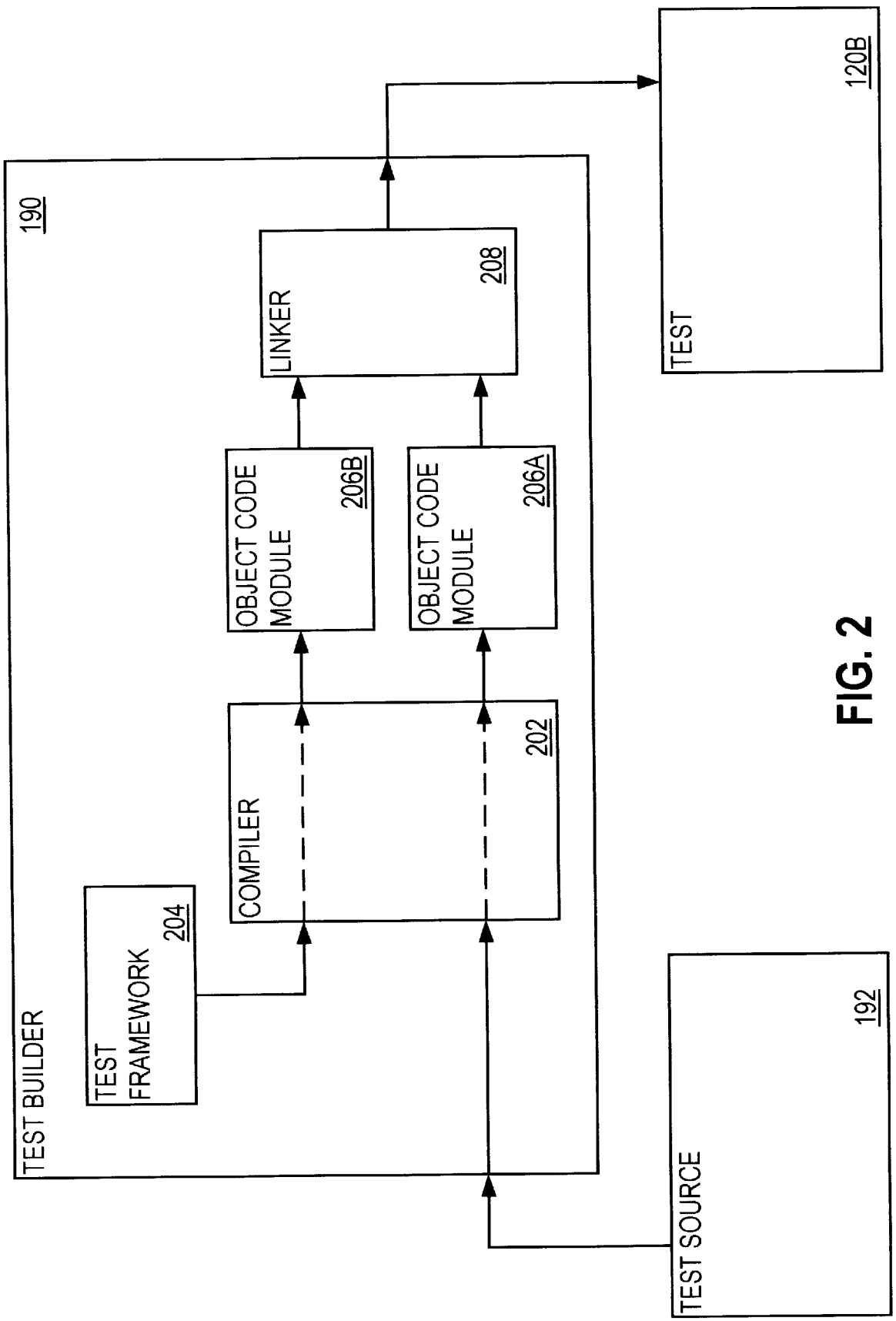
FIG. 2 is a logic flow diagram of the processing of a test of FIG. 1 in accordance with the present invention.

Test builder 190 is shown in greater detail in FIG. 2. Test builder 190 includes a compiler 202 which translates computer instructions and data in source code form into computer instructions and data in object code form. Compiler 202 is conventional and can be, for example, a compiler which translates computer instructions which comport with the known C++ computer instruction language into object code form. Translation of computer instructions and data from source code form to object code form is generally referred to as "compiling" the computer instructions and data. Compiler 202 compiles test source 192 to form object code module 206A in memory 104.

Test builder 190 also includes a test framework 204, which is described more completely below and which defines classes, attributes, and member functions according to an object-oriented computer instruction language as described more completely below. Compiler 202 compiles test framework 204 to form object code model 206B in memory 104. A linker 208 of test builder 190 links object code modules 206A and 206B to form test 120B. Linker 208 is conventional and linking by a linker is well-known. Linking is described briefly for completeness.

It is common for software engineers who configure computer programs to configure modules of such computer programs and to compile the modules individually. In general, each module of a computer program contains references to computer instructions and/or data in other modules of the computer program and those references remain undefined after compilation of each module to form an object code module. A linker, such as linker 208, combines each object code module of a computer program and resolves references in one object code module to computer instructions and/or data of another object code module. It is appreciated that, while test framework 204 and test source 192 are shown to be individual modules, test framework 204 and/or test source 192 can be several modules, each of which can be compiled separately by compiler 202. For example, the base test class and the base device class can be defined in separate modules of test framework 204. As a result, changes in the base test class, for example, to implement a change in the communication protocol implemented by the base test class as described more completely herein, requires compiling only the module defining the base test class and inclusion of the resulting object code module in test 120B by linker 208.

Thus, test builder 190 includes in test 120B computer instructions and data provided by test framework 204 in addition to the computer instructions and data of test source 192. Test framework 204 provides test and device management mechanisms which can be relied upon by a test design engineer in designing and implementing test 120B by configuration of test source 192. In one embodiment, such mechanisms are defined in an object-oriented computer instruction language, such as the C++ computer instruction language. Object-oriented computer instruction languages are well-known, but a brief description of basic object-oriented concepts aids appreciation of the described embodiment of the present invention.

In an object-oriented environment, computer instructions represent objects which have a state and a behavior. Components of the state of an object and the behavior of the object are defined by a class to which the object belongs. A class defines a number of attributes and member functions of the object which belong to the class. An attribute is a component of the state of an object and the value of an attribute can vary from one object of a class to another object of the class. For example, a class of tables can define a color attribute. Each object of the class of tables has a color attribute, but the value of the color attribute of one table can specify the color red while the value of the color attribute of another table can specify the color green. A member function is a collection of computer instructions and data which collectively define a task which can be performed by an object. For example, a table can be asked to bear a weight, and the behavior of the table in bearing the weight is defined by the member function provided by the table class for bearing a weight. In addition, the member function provided by the table class is performed in the context of the state of the particular table which is bearing the weight. For example, the state of a table can include various dimensions of the table, the materials from which the table is made, and the amount of weight already supported by the table. The specific behavior of the table in bearing the weight can include, for example, changes in the state of the table including adding the weight to the amount of weight already supported by the table or breaking under the additional weight.

Two particularly helpful features of object-oriented environments is generally referred to as inheritance and polymorphism. Inheritance refers to inheritance of attributes and member functions of one class from another class according to a class hierarchy. Each class can have one or more subclasses, each of which can add attributes and/or member functions and can redefine member functions. For example, a desk class is a subclass of the table class and defines an additional attribute which specifies the number of drawers of the desk. Thus, in addition to an attribute which defines the number of drawers of the desk, a desk inherits from the table class the color attribute and the attributes specifying various dimensions of the desk. Furthermore, a desk can perform the weight bearing member function described above and the behavior of the desk in performing the weight bearing member function is defined by the table class. The desk class can define additional member functions not defined by the table class, e.g., an open drawer member function, a place object in drawer member function, a remove object from drawer member function, and a close drawer member function. As described above, a subclass can also redefine an inherited member function, thereby superseding the inherited definition of the member function. For example, the table class can have a subclass which is a folding table class. The weight bearing member function described above can be redefined by the folding table class such that a folding table asked to bear a weight is verified to be in an unfolded, upright position prior to bearing any weight.

A member function defined by a class is performed by directing an object of the class perform the member function. The particular member function performed is selected according to the class to which the object belongs. If the class to which the object belongs does not define such a member function, the member function is selected from the superclass which defines the member function and for which no subclass defines the member function. A first class is a superclass of a second class if the second class is a subclass of the first class. The member function is performed in the context of the state of the object directed to perform the member function. As described above, the particular behavior of a table which is directed to perform the weight bearing member function described above depends on the state of the table, including the particular dimensions of the table, the materials from which the table is made, and the amount of weight already supported by the table.

Polymorphism refers to the ability of a pointer to identify an object of a particular class or an object of a subclass of the particular class. Suppose, for example, that test source 192 defines as a part of test 120B a pointer to a table, i.e., an instance of the table class described above. During execution of test 120B, the particular object referenced by the pointer can be an instance of a subclass of the table class, e.g., can be a desk object. This is permitted since a desk is a table, i.e., a desk object is a member of the table class since the desk class is a subclass of the table class. When the object referenced by the pointer is directed to perform a member function, e.g., the weight bearing member function described above, the particular computer instructions executed in performance of the member function are specified by the desk class notwithstanding defining the pointer to be a pointer to an object of the test class. Polymorphism is a powerful feature since test source 192 can be configured to process objects of a particular class, new subclasses of the particular class can be later defined, and the remainder of test source 192 can process objects of those new subclasses without adaptation or modification.

Thus, as a result of inheritance, test framework 204 can define base classes for test objects and for device objects and can define in such base classes attributes and member functions which are inherited by all objects of all subclasses of such base classes. For example, behavior of a test object in faithfully and accurately implementing protocols described in the above-referenced U.S. Patent Applications is defined by attributes and member functions defined by a base class for test objects and such attributes and member functions are inherited by all test objects defined in test source 192. Accordingly, all test objects created in accordance with computer instructions of test source 192 faithfully and accurately implement the protocols of the above-referenced U.S. Patent Applications without significant effort by a test design engineer in configuring test source 192. In addition, as a result of polymorphism, portions of test source can be configured by a test design engineer and can be used later to process objects of subsequently defined without adaptation or modification of the earlier configured portions of test source 192.

Base Test Class

Figure 3:
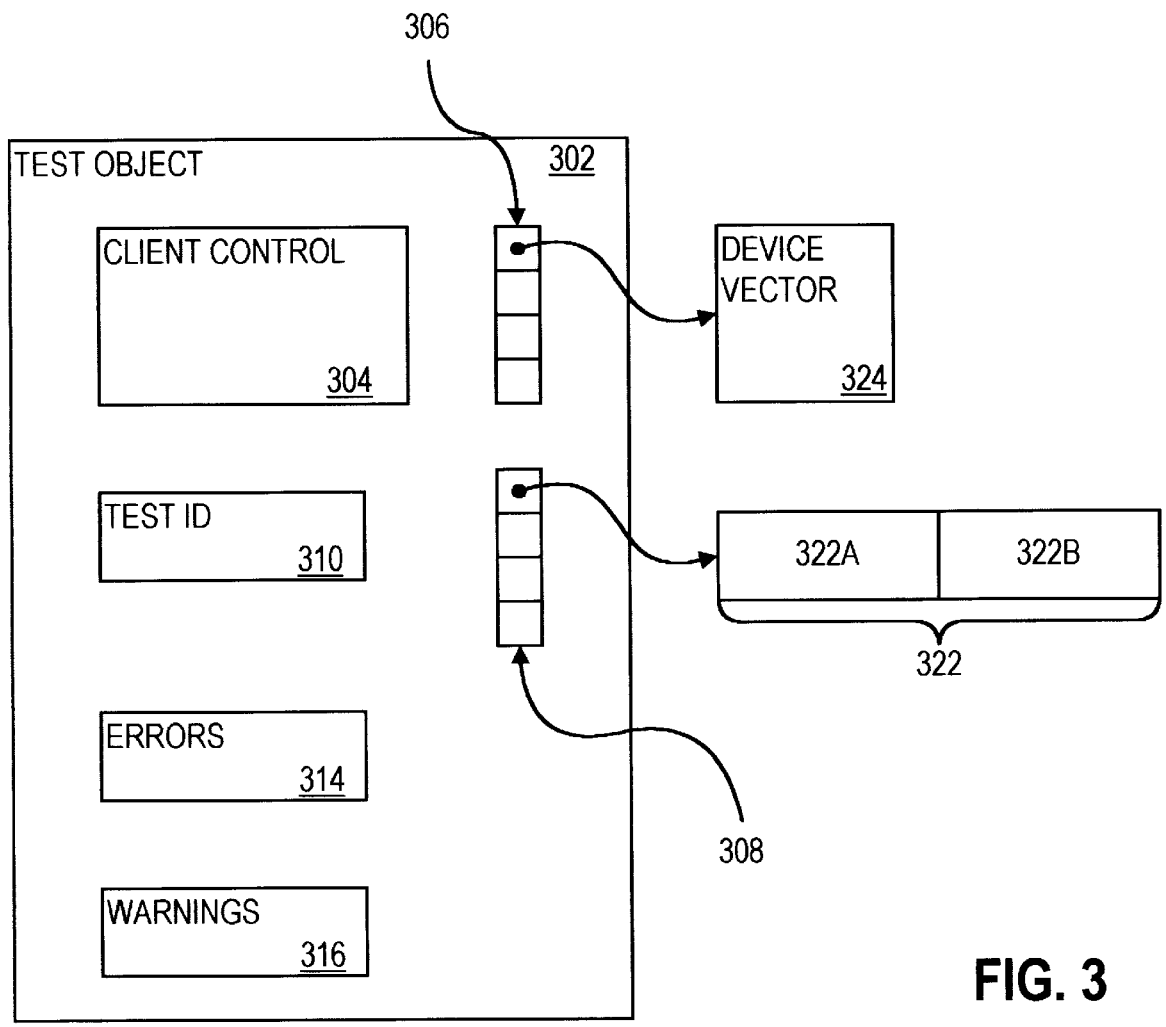
FIG. 3 is a block diagram of a test object.

Test framework 204 defines a base test class which defines a number of attributes and member functions of test object. A test object represents the test itself, e.g., test 120B, and is generally the sole object of test 120B which interacts directly with hub 130. All other objects interact with hub 130 by directly or indirectly directing a test object to interact with hub 130. As a result, any changes in the protocol through which test 120B and hub 130 interact can be implemented by changes solely to the base test class or a subclass thereof The structure of such a test object as defined by the attributes defined by the base test class is illustrated in FIG. 3. FIG. 3 shows a test object 302 which includes (i) a device vector list 306, (ii) a device signals list 308, (iii) a test identification field 310, (iv) an errors field 314, and (v) a warnings field 316. As used herein, a field is a collection of data which collectively define a particular piece of information. A flag is a field which includes data indicating one of two possible states, e.g., true or false.

Figure 4:
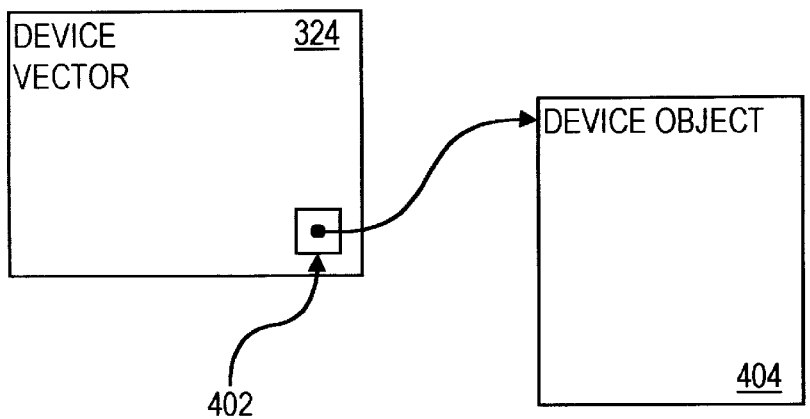
FIG. 4 is a block diagram of a device vector of the test object of FIG. 3.

Device vector list 306 is a list of pointers to device vectors, e.g., device vector 324 which is shown more completely in FIG. 4. Device vector 324 includes a pointer 402 to base device 404. A pointer to an object is a field which contains data uniquely identifying the object. In general, a list such as device vector list 306 cannot contain pointers to objects of different classes in the C++ computer instruction language. However, pointer 402 is defined to be a pointer to an object of the base device class, which is described more completely below, and can therefore point to an object of the base device class or any subclass, directly or indirectly, of the base device class. Accordingly, device vector list 324. indirectly references a number of device objects which can be objects of subclasses, defined in test source 192 (FIG. 2) by a test design engineer, of the base device class. The device objects referenced indirectly by device vector list 306 (FIG. 3) represent devices accessed by the test represented by test object 302.

Device signal list 308 is a list of pointers to device signal records, e.g., device signal record 322 which includes a simulation identification field 322A and a device identification field 322B. Simulation identification field 322A contains data identifying one of the simulation systems registered with hub 130, e.g., one of simulation systems 140A–C, as the simulation system which simulated a particular device represented by a corresponding one of the device objects referenced indirectly by device vector list 306. Device identification field 322B contains data identifying the particular device. In one embodiment, device signal list 308 is sorted according to the numeric value represented by data stored in device signal records of device signal list 308, e.g., device signal record 322 in which simulation identification field 322A represents an upper byte and in which device identification field 322B represents a lower byte. By sorting device signal records of device signal list 308, efficiency in searching device signal list 308 for a specific device signal record is improved. In such an embodiment, the device vectors of device vector list 306 are ordered such that a device vector corresponding to a particular device signal record is positioned within device vector list 306 which corresponds to the position of the particular device signal record in device signal list 308.

Test identification field 310 contains data which uniquely identifies test object 302 and test 120B from all other tests and simulation systems of the simulation controlled through hub 130 (FIG. 1). Each of tests 120A–C generally include only one test object.

Errors field 314 contains data representing the number of errors encountered during processing on behalf of test object 302. Warnings field 316 contains data representing the number of warnings encountered during processing on behalf of test object 302. In general, an error is issued when test 120B enters an invalid state which likely results in prejudice to the result produced by test 120B. In other words, an error indicates that the design simulated by simulation systems 140A–C is known with a relatively high degree of certainty to have been erroneously simulated or erroneously tested. A warning is issued when test 120B enters an invalid state which may result in prejudice to the result produced by test 120B. In other words, a warning indicates that the accuracy and correctness of the simulation or the testing of the design simulated by simulation systems 140A–D is in doubt. Errors field 314 and warnings field 316 are used to evaluate the design of test 120B and to identify potential programming errors in either test source 192 (FIG. 2) or test framework 204. In addition, errors and warnings can result from errors in the proper simulation of the design of the simulated circuitry by simulation systems 140A–C or in the design of the simulated circuitry.

Figure 5:
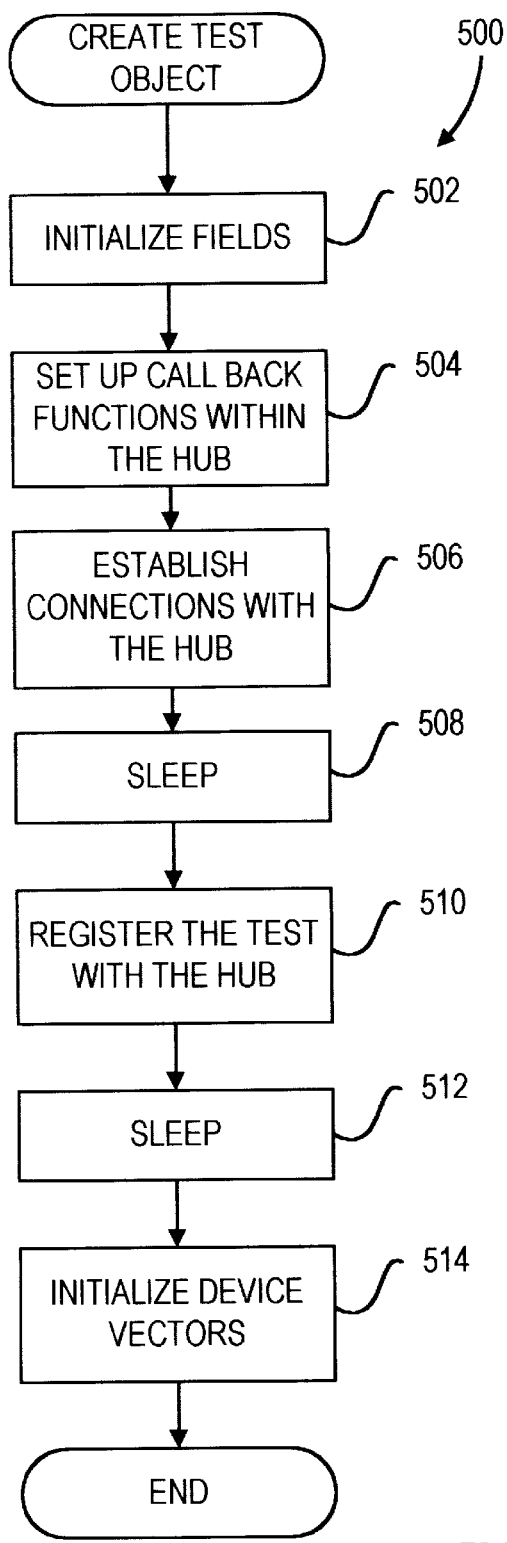
FIG. 5 is a logic flow diagram of the creation member function of the test object of FIG. 3.

In the C++ computer instruction language, creation of an object of a class causes execution of a creation member function of every class from which the object can inherit attributes or member functions. The base test class defines a creation member function execution of which is represented by logic flow diagram 500 (FIG. 5). Thus, in creating test object 302 (FIG. 3), the steps of logic flow diagram 500 (FIG. 5) are performed in the context of test object 302 FIG. 3). In step 502, the fields of test object 302 FIG. 3) as described above are initialized. Specifically, errors field 314 is initialized to indicate no errors have been encountered, and warnings field 316 is initialized to indicate that no warnings have been encountered.

In step 504 FIG. 5), test object 302 sets up a number of call back functions for interaction with hub 130. Specifically, test object 302 specifies respective member functions of test object 302 to be executed in response to each of a signal message, slave message, load message, and read message received from hub 130. Messages are described more completely in the Interface Application and that description is incorporated herein by reference.

In step 506 (FIG. 5), test object 302 (FIG. 3) establishes an RPC connection with hub 130. An RPC connection is described more completely in the Interface Application and that description is incorporated herein by reference. In step 508 (FIG. 5), test object 302 suspends execution by invoking a sleep member function which is described more completely below. Execution of test object 302 is suspended until test object 302 receives a signal message from hub 130 to indicate that hub 130 has successfully established the RPC connection.

In step 510 (FIG. 5), test object 302 (FIG. 3) registers with hub 130 (FIG. 1) by sending to hub 130 a registration message. The Synchronization Application describes a synchronization mechanism which involves local synchronization threads of hub 130. When implementing the synchronization mechanism described in the Synchronization Application, hub 130 creates the local synchronization thread in response to the registration method. In step 512 FIG. 5), test object 302 (FIG. 3) suspends execution again by invoking a sleep member function which is described more completely below. Execution of test object 302 is suspended until test object 302 receives a signal message from hub 130 to indicate that test object 302 (FIG. 3) has been successfully registered with hub 130 (FIG. 1). Thus, by merely creating a test object as defined in the base test class as defined in test framework 204 (FIG. 2), call back functions and an RPC connection are established and test object 302 is registered to implement the interface described in the Interface Application with no additional effort by a test design engineer configuring test source 192.

In step 514 (FIG. 5), test object 302 (FIG. 3) fills device vector list 306 with pointers to newly created device vectors which in turn each include a pointer to a device placeholder. A device placeholder is a device object which includes a simulation identification field which is not a valid simulation identifier. A device placeholder does not represent a device of any simulation system. Thus, in accordance with logic flow diagram 500 (FIG. 5), test object 302 (FIG. 3) is initialized to faithfully and accurately implement the interface described in the Interface Application. A test design engineer can augment the behavior and initialization of test object 302 by defining one or more subclasses of the base test class and creating test object 302 as belonging to such a subclass.

Figure 6:
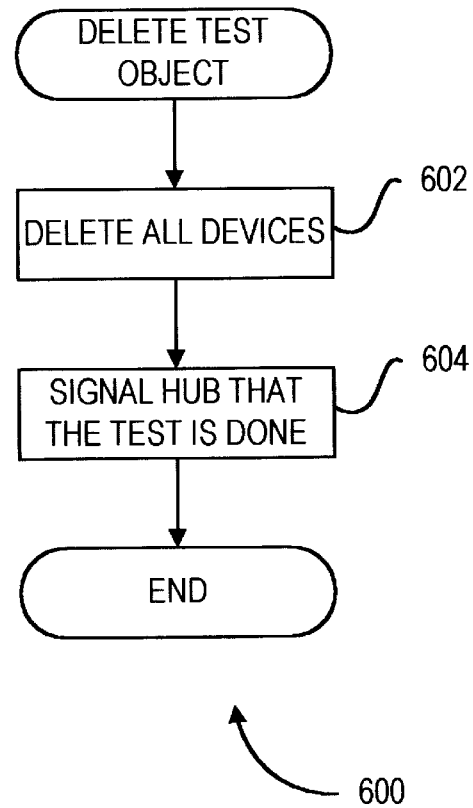
FIG. 6 is a logic flow diagram of the deletion member function of the test object of FIG. 3.

Logic flow diagram 600 (FIG. 6) illustrates the member function performed by test object 302 (FIG. 3) when deleted. When test object 302 is deleted, test object 302 performs the deletion member function defined by every class from which test object 302 can inherit attributes or member functions. In step 602 (FIG. 6), test object 302 (FIG. 3) clears and deletes device vector list 306, first deleting each device vector, e.g., device vector 324, of device vector list 306 and each device referenced by a pointer of a device vector of device vector list 306. In step 604 (FIG. 6), test object 302 (FIG. 3) sends a signal message to hub 130 (FIG. 1) to terminate interaction between hub 130 and test object 302 (FIG. 3). Thus, by deleting a test object as defined in the base test class as defined in test framework 204 (FIG. 2), resources used by the test object are deleted properly and interaction with hub 130 is properly terminated in accordance with the interface described in the Interface Application with minimal effort by a test design engineer configuring test source 192.

Test object 302 (FIG. 3) indicates that execution of test object 302 is to resume in response to a signal from a particular device by storing in device signal list 308 a pointer to a device signal record which identifies the particular device. The base test class of test framework 204 (FIG. 2) defines a member function by which a device signal record, e.g., device signal record 322, corresponding to a device specified by simulation identifier and device identifier. Thus, a test design engineer can configure a test object defined in test source 192 (FIG. 2) to resume execution in response to an event of a device by merely specifying the simulation identifier and device identifier of the device and invoking the member function. The base test class further defines a member function by which a device signal record is removed from device signal list 308 (FIG. 3) such that a test design engineer can just as easily configure a test object defined in test source 192 (FIG. 2) to no longer resume execution in response to an event of the device.

Figure 7:
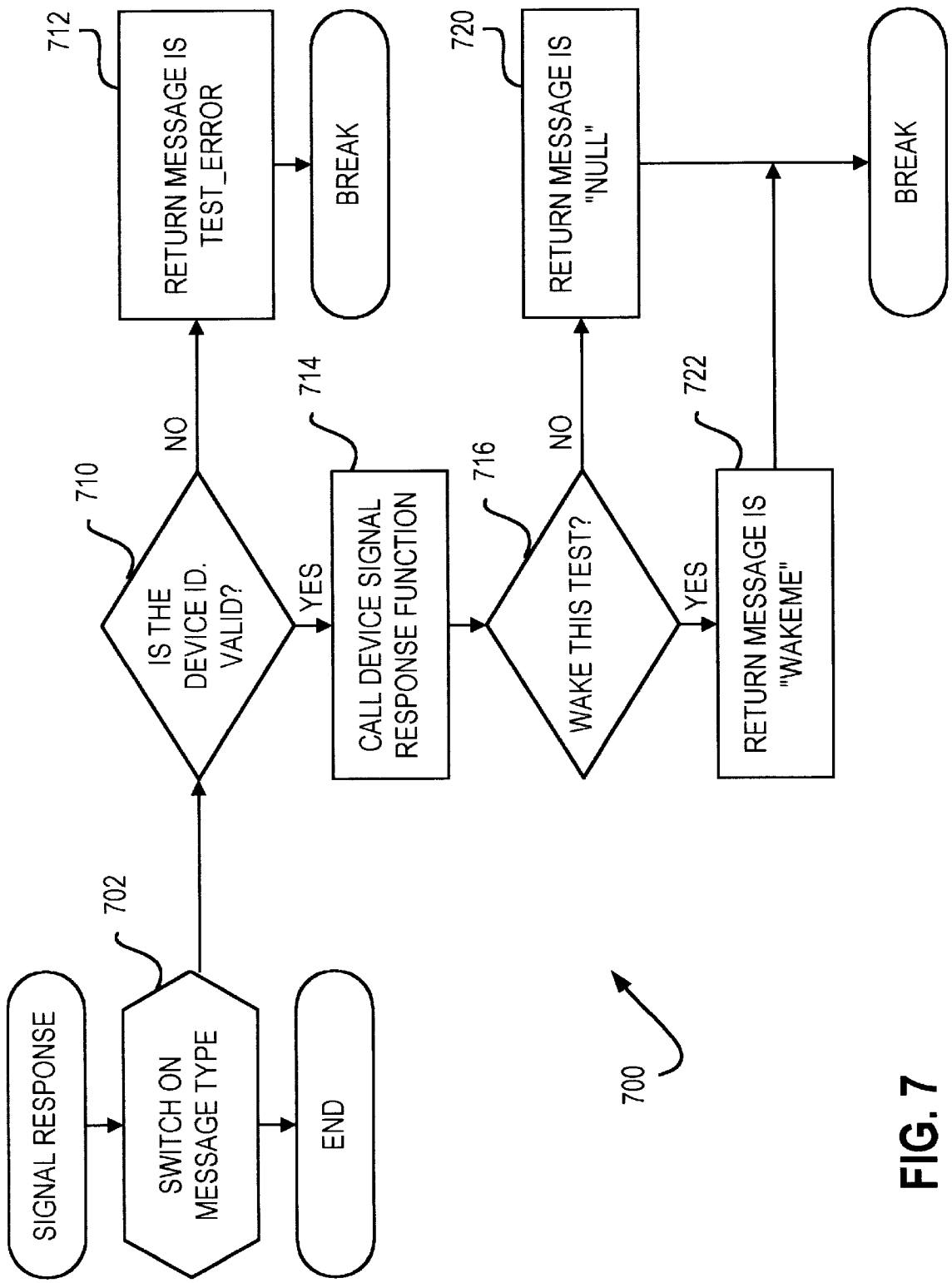
FIG. 7 is a logic flow diagram of the processing of the test object of FIG. 3 in response to a signal received from the hub of FIG. 1.

The base test class defined by test framework 204 (FIG. 2) defines a member function in which test 302 FIG. 3) responds to a signal message from hub 130 (FIG. 1), and the member function is illustrated by logic flow diagram 700 (FIG. 7). Processing begins in switch step 702 in which test 302 (FIG. 3) determines the type of signal message received from hub 130 (FIG. 1). Processing transfers from switch step 702 (FIG. 7) to decision step 710. In decision step 710, test object 302 determines whether a valid device identifier specifies the sender of the simulation device signal message. If the device identifier of the sending device is not a valid device identifier, processing transfers to step 712 in which the return message to hub 130 (FIG. 1) indicates an error in the processing of test object 302 (FIG. 3) and processing according to logic flow diagram 700 completes. Hub 130 (FIG. 1) generally does not contain devices which can signal a test such as test 120B as represented by test object 302; however, hub 130 sends signal messages to test 120B, for example, to direct test 120B to resume execution. Accordingly, hub 130 is represented within test 120B by a hub device object, which is a member of a hub device class which in turn is a subclass of the base device class described below. Therefore, hub 130 is represented by a hub device object which has a valid device identifier.

Conversely, if the device identifier of the sending device is a valid device identifier, processing transfers to step 714 in which a member function of the device object representing the sending device for responding to a signal from the sending device is performed. Device objects and the signal response member function is described more completely below. Performance of the signal response member function of the sending device produces data specifying whether the test is to resume execution in response to the received signal. Processing transfers from step 714 to decision step 716 in which test object 302 (FIG. 3) determines whether execution of test 120B is to resume in response to the received signal as indicated by the data produced in step 714. If test 120B is to resume execution, processing transfers to step 722 in which the return message to hub 130 (FIG. 1) indicates that execution of test 120B should resume. Conversely, if test 120B is not to resume execution, processing transfers to step 720 in which the return message to hub 130 (FIG. 1) indicates that execution of test 120B should remain suspended. After step 720 or step 722, processing according to logic flow diagram 700 completes.

Thus, by creating a test object as defined in the base test class as defined in test framework 204 (FIG. 2), the test object is configured to respond to a signal message from hub 130 to faithfully and accurately implement the interface described in the Interface Application with minimal effort by a test design engineer configuring test source 192.

Figure 9:
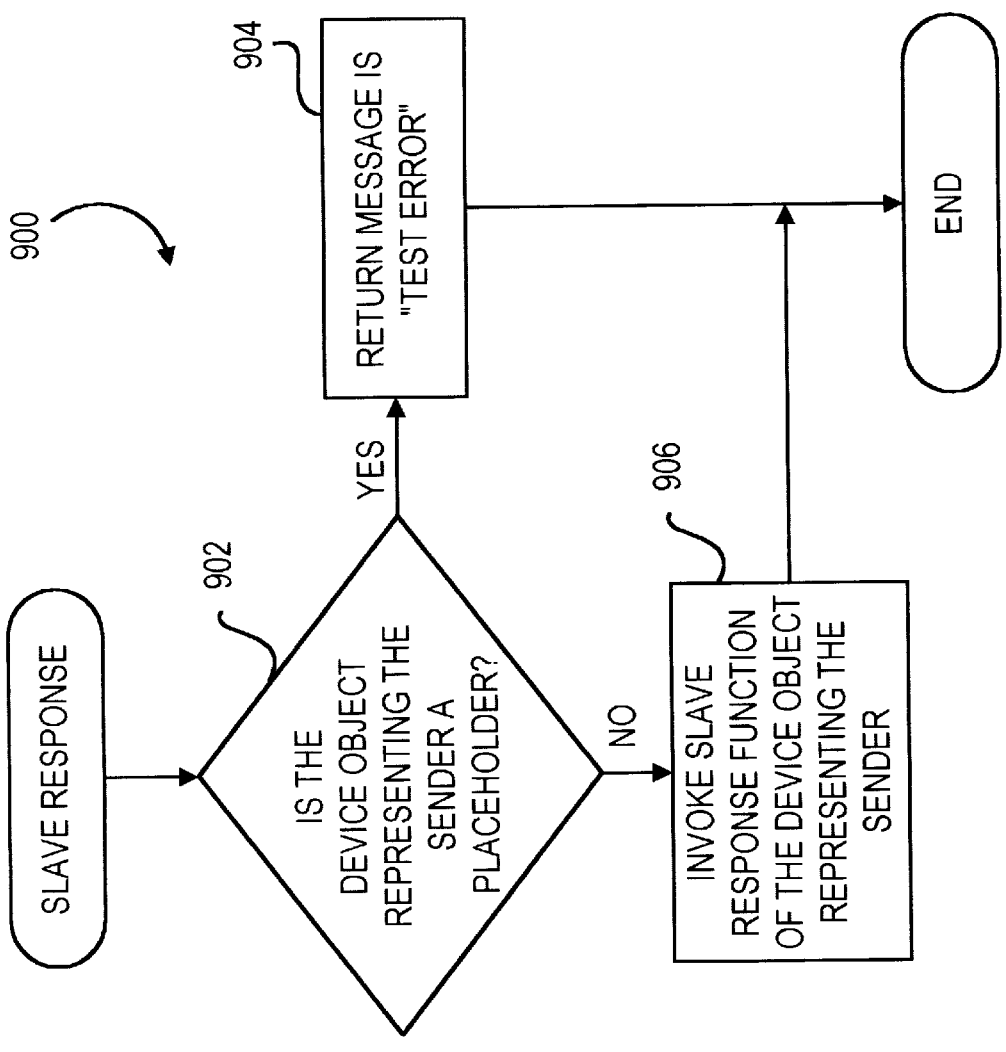
Figure 8:
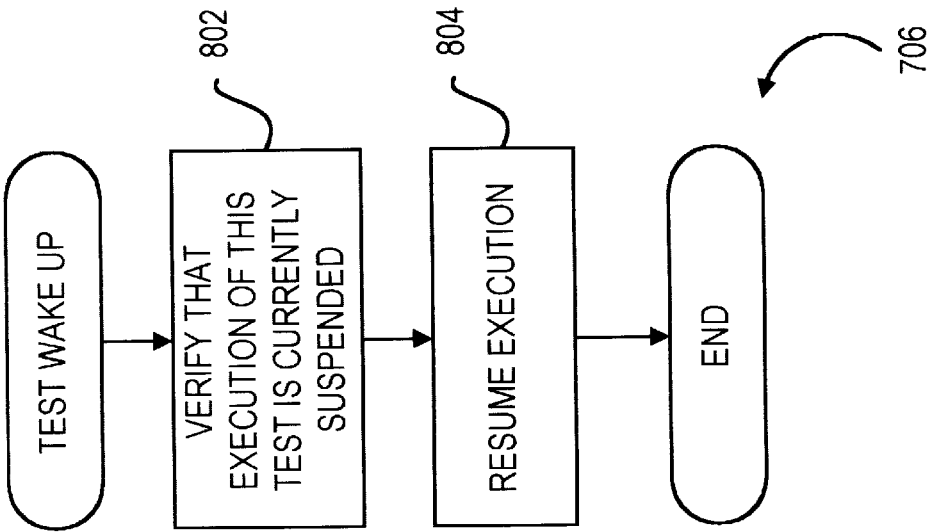
FIG. 8 is a logic flow diagram of the processing of the test object of FIG. 3 in resuming execution.

The base test class also provides member functions for responding to slave messages, load messages, and read messages received from hub 130 (FIG. 1) by a test object such as test object 302 (FIG. 3). Device objects, which are described below, and other objects generally interact with hub 130 and simulation systems 140A–C indirectly through invocation of these member functions of test objects. The member function for responding to slave messages is illustrated by logic flow diagram 900 (FIG. 9) in which processing begins in decision step 902. In decision step 902, test 302 (FIG. 3) determines whether a device placeholder is the device object representing the device which is indicated as the sender of the slave message. If a device placeholder represents the sending device, processing transfers to step 904 (FIG. 9) in which the return message to hub 130 (FIG. 1) indicates an error in the processing of test 302 (FIG. 3) and processing according to logic flow diagram 900 completes. Conversely, if a device object which is not a device placeholder represents the sending device, processing transfers to step 906 (FIG. 9) in which a member function of the device object representing the sending device for responding to a slave message from the sending device is performed. After either step 904 or step 906, processing according to logic flow diagram 900 completes.

Figure 10:
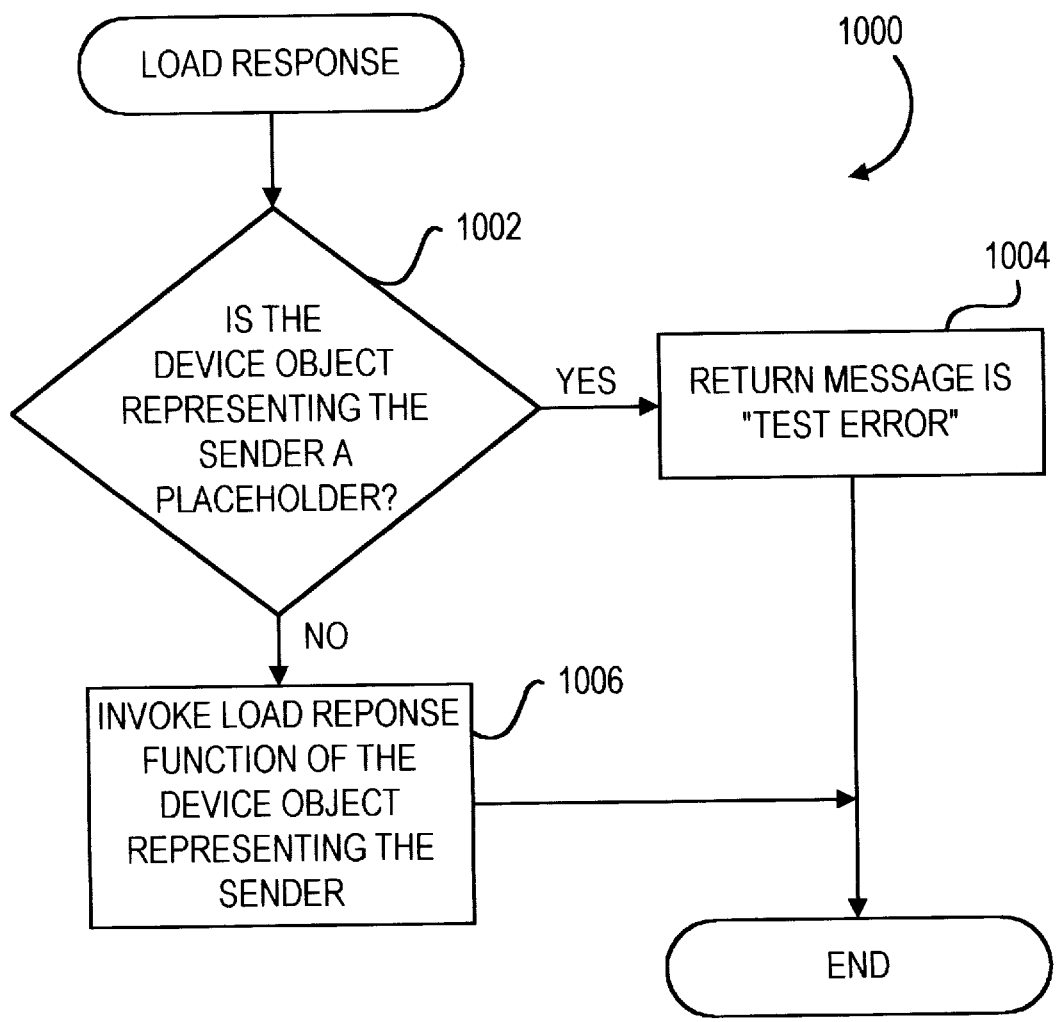

The member function for responding to load messages is illustrated by logic flow diagram 1000 (FIG. 10) in which processing begins in decision step 1002. In decision step 1002, test 302 (FIG. 3) determines whether a device placeholder is the device object representing the device which is indicated as the sender of the load message. If a device placeholder represents the sending device, processing transfers to step 1004 FIG. 10) in which the return message to hub 130 (FIG. 1) indicates an error in the processing of test 302 (FIG. 3) and processing according to logic flow diagram 1000 completes. Conversely, if a device object which is not a device placeholder represents the sending device, processing transfers to step 1006 (FIG. 10) in which a member function of the device object representing the sending device for responding to a load message from the sending device is performed. After either step 1004 or step 1006, processing according to logic flow diagram 1000 completes.

Figure 11:
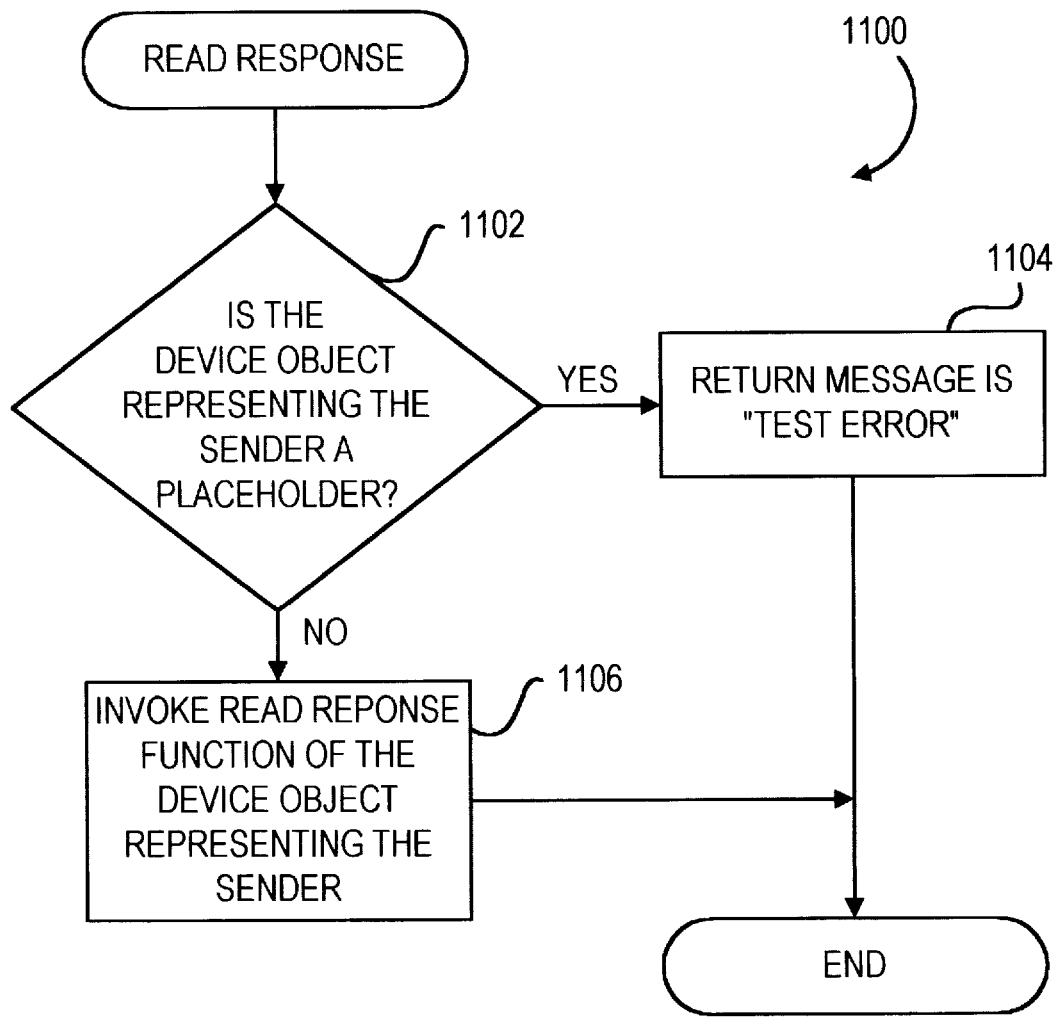

The member function for responding to read messages is illustrated by logic flow diagram 1100 (FIG. 11) in which processing begins in decision step 1102. In decision step 1102, test 302 (FIG. 3) determines whether a device placeholder is the device object representing the device which is indicated as the sender of the read message. If a device placeholder represents the sending device, processing transfers to step 1104 (FIG. 11) in which the return message to hub 130 (FIG. 1) indicates an error in the processing of test 302 (FIG. 3) and processing according to logic flow diagram 1100 completes. Conversely, if a device object which is not a device placeholder represents the sending device, processing transfers to step 1106 (FIG. 11) in which a member function of the device object representing the sending device for responding to a read message from the sending device is performed. After either step 1104 or step 1106, processing according to logic flow diagram 1100 completes.

The base test class provides member functions for sending to hub 130 (FIG. 1) signal messages, load messages, and read messages by a test object such as test object 302 (FIG. 3). The member function by which a test object, e.g., test object 302 (FIG. 3), sends to hub 130 (FIG. 1) a signal message is illustrated by logic flow diagram 1200 (FIG. 12) in which processing begins in step 1204. In step 1202, test object 302 FIG. 3) builds a new signal message which comports with the particular structure of a signal message which can be sent to hub 130 (FIG. 1) in accordance with the interface described in the Interface Application. In step 1206 (FIG. 12), test object 302 FIG. 3) sends the signal message built in step 1204 (FIG. 12) to hub 130 (FIG. 1). In accordance with the RPC protocol of the interface described in the Interface Application, execution of test object 302 (FIG. 3) is suspended pending receipt of a return message from hub 130 (FIG. 1). The return message is included in the return of the remote procedure call. When the return message is received, execution of test object 302 (FIG. 3) resumes and processing transfers to step 1208 in which test object 302 (FIG. 3) returns as a result of the signal message member function the return data included in the return message. The return data indicates whether the signal message is successfully processed by hub 130 (FIG. 1).

The member function by which a test object, e.g., test object 302 (FIG. 3), sends to hub 130 (FIG. 1) a load message is illustrated by logic flow diagram 1300 (FIG. 13) in which processing begins in step 1304. In step 1304 (FIG. 13), test 302 object (FIG. 3) builds a new send message data structure and a new receive message data structure which comport with the particular structure of send and receive message data which can be sent to hub 130 (FIG. 1) in a message in accordance with the interface described in the Interface Application. The send message data structure built in step 1304 includes data which specifies a mailbox of a simulation system registered with hub 130 indicates that hub 130 is to load a value in the specified mailbox. In step 1306 (FIG. 13), test object 302 (FIG. 3) sends the send message and receive message data structures built in step 1304 (FIG. 13), which collectively define a load message, to hub 130 (FIG. 1). In accordance with the RPC protocol of the interface described in the Interface Application, execution of test object 302 (FIG. 3) is suspended pending receipt of a return message from hub 130 (FIG. 1). The return message is included in the return of the remote procedure call. When the return message is received, execution of test object 302 (FIG. 3) resumes and processing transfers to step 1308 in which test object 302 (FIG. 3) returns as a result of the load message member function the receive message data structure which is included in the return message and which includes data returned by hub 130 which in turn indicates whether the load message is successfully processed by hub 130 (FIG. 1).

The member function by which a test object, e.g., test object 302 (FIG. 3), sends to hub 130 (FIG. 1) a read message is illustrated by logic flow diagram 1400 FIG. 14)

in which processing begins in step 1404. In step 1404, test 302 object (FIG. 3) builds a new send message data structure and a new receive message data structure which comport with the particular structure of a send message which can be sent to hub 130 (FIG. 1) in accordance with the interface described in the Interface Application. The send message data structures built in step 1404 includes data which specifies a mailbox of a simulation system registered with hub 130 indicates that hub 130 is to read a value from the specified mailbox. In step 1406 (FIG. 14), test object 302 (FIG. 3) sends the send message and receive message data structures built in step 1404 (FIG. 14), which collectively define a read message, to hub 130 (FIG. 1). In accordance with the RPC protocol of the interface described in the Interface Application, execution of test object 302 (FIG. 3) is suspended pending receipt of a return message from hub 130 (FIG. 1). The return message is included in the return of the remote procedure call. When the return message is received, execution of test object 302 (FIG. 3) resumes and processing transfers to step 1408 in which test object 302 (FIG. 3) returns as a result of the read message member function the receive message data structure included in the return message. The receive message data structure includes data supplied by hub 130 which indicates whether the read message is successfully processed by hub 130 (FIG. 1). The data read from the specified mailbox by hub 130 (FIG. 1) in response to the read message is stored in a destination address supplied by an object which invokes the read message member function.

Since, in logic flow diagrams 1200, 1300, and 1400, test object 302 (FIG. 3) builds a send message which comports with the interface which is described in the Interface Application and according to which test object 302 and hub 130 (FIG. 1) interact with one another, a test object which inherits the signal message member function, the load message member function, and the read message member function from the base test class defined by test framework 204 (FIG. 2) faithfully and accurately implements the interface described in the Interface Application with minimal effort and time expended by a test design engineer in configuring test source 192.

The base test class provides a continue simulation member function by which a test object, e.g., test object 302 (FIG. 3), signals hub 130 (FIG. 1) to allow the simulation controlled through hub 130 to continue. The continue simulation member function is illustrated by logic flow diagram 1500 (FIG. 15). In step 1502, test 302 (FIG. 3) sends to hub 130 (FIG. 1) a message, using the signal message member function described above, which indicates that test object 302 (FIG. 3) grants permission for the simulation controlled through hub 130 (FIG. 1) to execute. In addition, the message sent in step 1502 includes data specifying an event queue in hub 130 corresponding to an event, occurrence of which should cause resumption of execution of test object 302 (FIG. 3). As described in the Synchronization Application, execution of a thread or process is only resumed after execution of the thread or process is verified to be suspended. In accordance with the interface described in the Interface Application, hub 130 (FIG. 1) places a reference to test object 302 FIG. 3) on the specified event queue such that occurrence of the corresponding event causes hub 130 (FIG. 1) to signal test object 302 (FIG. 3). In step 1504 (FIG. 15), test object 302 (FIG. 3) suspends execution until signaled by hub 130 (FIG. 1) and processing according to logic flow diagram 1500 (FIG. 15) completes. Thus, to cause a test object which inherits the continue simulation member function can be directed to allow the simulation controlled through hub 130 to resume execution in a manner which comports with the interface described in the Interface Application by directing the test object to perform the continue simulation member function and supplying to the test object specification of an event queue.

The Base Device Class

Test framework 204 (FIG. 2) also defines a base device class which defines attributes and member functions which are inherited by device objects. A device object is an object which represents, within a test object, a device of a simulation system of the simulation controlled through hub 130 (FIG. 1), e.g., simulation system 140A. The attributes of a device object as defined by the base device class are illustrated in FIG. 16.

Device object 404 includes (i) a simulation identification field 1604, (ii) a device identification field 1606, (iii) a pointer 1606 to test object 302, (iv) a pointer 1610 to a register list 1612, (v) a pointer 1616 to a transaction list 1618, and (vi) a pointer 1622 to response list 1624. Simulation identification field 1604 contains data which uniquely identifies a simulation system registered with hub 130 (FIG. 1), e.g., simulation system 140A. Device identification field 1606 (FIG. 16) contains data which uniquely identifies a device of the simulation system identified by simulation identification field 1604. Together, simulation identification field 1604 and device identification field 1606 uniquely identify a device of the simulation controlled through hub 130 (FIG. 1). Pointer 1606 identifies test object 302 as a context for the device object.

Register list 1612 (FIG. 16) is a list of pointers to register objects, e.g., register object 1614. Register objects are described in greater detail below. Briefly, a register object represents a range of register addresses of a device of the simulation controlled through hub 130 (FIG. 1). For example, register objects of register list 1612, e.g., register object 1614, represent various register address ranges of the device represented by device object 404.

Transaction list 1618 is a list of pointers to transaction objects, e.g., transaction object 1620. Transaction objects represent a transaction involving the device represented by device object 404. A transaction is a collection of register read operations and register write operations which can be bundled and issued to a simulation system without requiring execution of the simulation system between such operations. By including a list of transaction objects in device object 404, an extensive, complex list of transactions can be included in device object 404 which can then send, in rapid sequence, the register read/write operations of each transaction prior to allowing execution of the simulation system to resume.

Response list 1624 is a list of pointers to response objects, e.g., response object 1626. Response objects represent a response to a transaction involving the device represented by device object 404. For example, response object 1626 includes a number of computer instructions which specify particular adaptations of the behavior of device object 404. Since response list 1624 is a list, response objects can be insert into or removed from response list 1624 during execution. This is in contrast to definition of the behavior of device object 404 provided by the base device class since such definitions are fixed at compile time, i.e., generally cannot be changed after translated from source code to object code. In addition, since the items of response list 1624 are pointers to response objects, each can identify a response of a different class and can be changed or replaced during execution. By changing or replacing the response objects of response list 1624, the particular behavior of device object 404 in response to signals received from any of simulation systems 140A–C can be altered with requiring re-compilation of test 120B from test source 192 and test framework 204. The following example illustrates some of the advantages of the use of response objects.

Consider the illustrative example in which simulation systems 140A–C collectively simulate a computer mother board under test which includes a CPU and associated circuitry and a bus through which additional devices can be connected to the CPU and other circuitry of the mother board. Suppose further that a verification engineer has defined classes, perhaps for an earlier developed and executed test unrelated to the current test, which represent the states and behaviors of a number of respective magnetic disk drives which are known and available from various manufacturers. The verification engineer can create, in the context of test object 302, device object 404 FIG. 16) and configure device object 404 to represent a generic magnetic disk drive coupled to the mother board through the bus of the mother board. Device object 404 can be adapted to simulate any of the known, available disk drives by including in response list 1624 response object which specify the particular behavior of a particular one of the known, available disk drives. In addition, device object 404 can be repeatedly adapted in the same manner to simulate another of the known, available disk drives during execution of test 120B, i.e., without recompiling and relinking test 120B from test source 192 (FIG. 2) and test framework 204. In this way, the mother board simulated by simulation systems 140A–C can be verified to operate correctly with any of a number of known devices with which the mother board is designed to operate in a particularly fast and efficient manner.

Device object 404 also includes a pointer 1628 to a list 1630 of data check objects data check object 1632. Data check objects are used to detect discrepancies between expected data at particular addresses with data simulated at those particular addresses. For example, data check object 1632 specifies a particular value and associates the value with a unique tag. Device object 404 can then interact with the circuit under test through test object 302 (FIG. 3) and hub 130 (FIG. 1) and compare the resulting data from such interaction to the data stored in data check object 1632 (FIG. 16). Device object 404 uses the tag of data check object 1632 to associate the data of data check object 1632 with the expected resulting data of the interact with the circuitry under test.

The base device class defined by test framework 204 (FIG. 2) defines a number of member functions which are inherited by device objects such as device object 404 (FIG. 16). The base device class defines a creation member function which is performed for each device object created and which is illustrated by logic flow diagram 1700 (FIG. 17). In decision step 1702, the created device object, e.g., device object 404 (FIG. 16), determines whether device object 404 is created in the context of a test object. If device object 404 is not created in the context of a test object, a fatal error is detected and processing is terminated. Conversely, if device object 404 is created in the context of a test object, processing transfers to step 1704 in which pointer 1606 (FIG. 16) of device object 404 is initialized to identify the test object in the context of which device object 404 is created, e.g., test object 302. In decision step 1706 (FIG. 17), device object 404 (FIG. 16) determines whether a simulation identifier supplied by an object invoking creation of device object 404, and therefore invoking performance of the creation member function, is a valid simulation system identifier. In one embodiment, valid simulation system identifiers include position integers. If the supplied simulation identifier is not a valid simulation system identifier, the simulation identifier specifies that the created device object, e.g., device object 404, is a placeholder and does not represent a device of a simulation system and processing according to logic flow diagram 1700 (FIG. 17) completes. Conversely, if the supplied simulation identifier is a valid simulation system identifier, processing transfers to step 1708.

In step 1708, device object 404 FIG. 16) inserts a device vector to itself into the device vector list of the test object identified by pointer 1606, i.e., test object 302. Processing transfers to step 1710 (FIG. 17) in which device object 404 FIG. 16) requests reservation of the device represented by device object 404 on behalf of test object 302. The reservation of devices by a test is described more completely in the Reservation Application and that description is incorporated herein by reference. Briefly, a test which interacts with a device first requests and obtains exclusive access to the device by requesting reservation of the device. A test, e.g., test 120B (FIG. 1), requests reservation of a device by sending to hub 130 a signal message which includes data identifying the signal message as a request for reservation of a device and data identifying the device, reservation of which is requested. The signal message is sent to hub 130 by invocation of the signal message member function defined by the base test class described more completely above. After step 1710 (FIG. 17), processing according to logic flow diagram 1700, and therefore the device object creation member function, completes. Thus, by merely causing the creation of a device object, reservation of the device represented by the device object is automatically requested with minimal effort by a test design engineer designing and implementing test 120B by configuring test source 192.

The base device class defined by test framework 204 (FIG. 2) also defines a device object deletion member function which is performed for each device object which is deleted and which is illustrated by logic flow diagram 1800 (FIG. 18). In step 1802, the device object being deleted, e.g., device object 404 (FIG. 16), signals hub 130 (FIG. 1) to release the reservation of the device represented by device object 404 if device object 404 is not a device placeholder. A test, e.g., test 120B (FIG. 1), releases reservation of a device by sending to hub 130 a signal message which includes data identifying the signal message as a release of a reservation of a device and data identifying the device, reservation of which is released. The signal message is sent to hub 130 by invocation by device object 404 of the signal message member function defined by the base test class described more completely above. Thus, by merely causing the deletion of a device object, reservation of the device represented by the device object is automatically released with minimal effort by a test design engineer designing and implementing test 120B by configuring test source 192. Thus, the base device class defined by test framework 204 (FIG. 2) implements the device reservation mechanism described more completely in the Reservation Application with nominal concern regarding reservation of devices by such a test design engineer.

The base test class defines a get reservations member function which is invoked after creation of device objects needed by a test as determined by the particular design of the test as defined, for example, by the particular configuration of test source 192. Performance of the get reservations member function by a test object, e.g., test object 302 (FIG. 3), sends to hub 130 a signal message, using the signal message member function described above with respect to FIG. 12, which indicates that test object 302 (FIG. 3) has requested all needed devices. In response, hub 130 (FIG. 1) places test 120B, which corresponds to test object 302 (FIG. 3), in a reservation wait state, which is described more completely in the Synchronization Application and that description is incorporated herein by reference. Test object 302 (FIG. 3) then suspends execution of test 120B (FIG. 1) until test 120B is signaled by hub 130. As described more completely in the Reservation Application and the Synchronization Application, execution of test 120B resumes when hub 130 has granted all the requests for reservation of devices by test 120B, and those descriptions are incorporated herein by reference.

In step 1804 (FIG. 18), device object 404 removes the device vector to itself from the device vector list of the test object identified by pointer 1606 (FIG. 16), i.e., device vector list 306 (FIG. 3) of test object 302. In step 1806 (FIG. 18), device object 404 (FIG. 16) clears and deletes register list 1618. After step 1806 (FIG. 18), processing according to logic flow diagram 1800, and therefore the device object deletion member function, terminates.

Register Classes

Figure 19A:
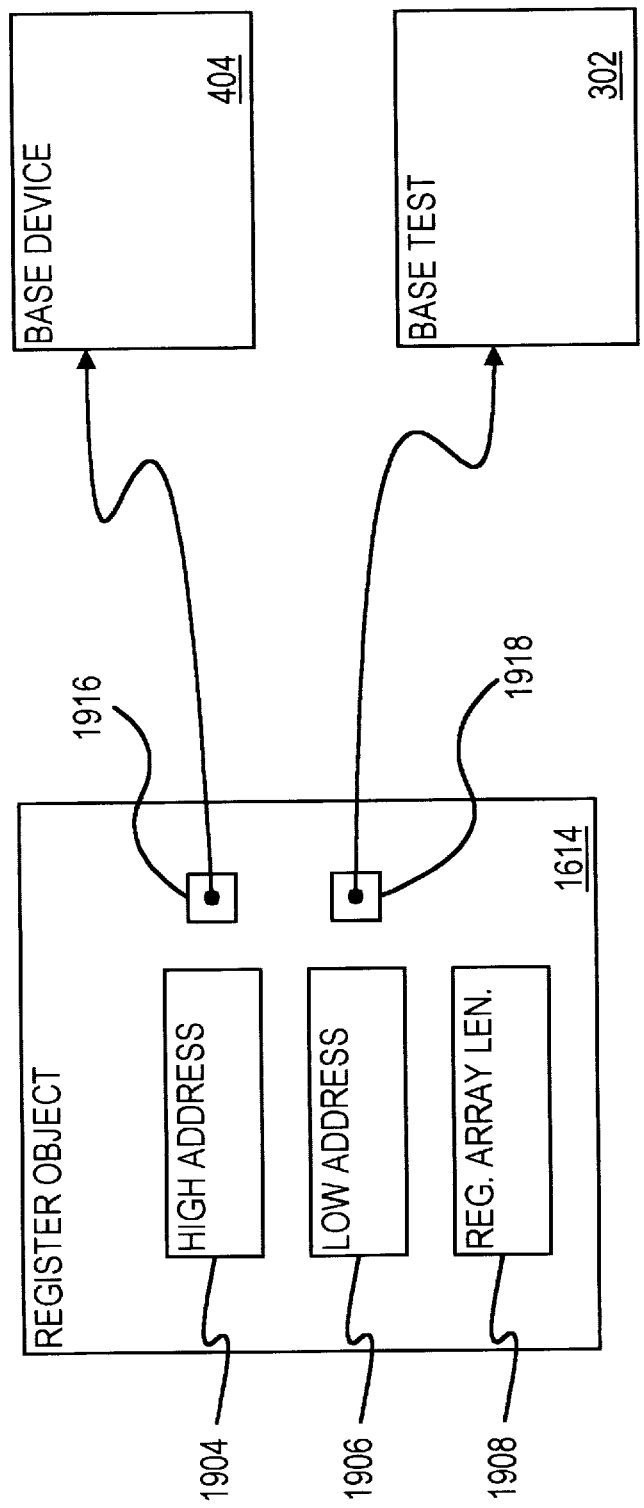
FIGS. 19A–C are block diagrams of a register object, a simulation register object, and a local register object, respectively, in accordance with the present invention.

Test framework 204 (FIG. 2) defines a base register class which in turn defines a number of attributes and member functions which are inherited by register objects. A register object, e.g., register object 1614 (FIG. 19A) inherits from the base register class attributes and member functions of the base register class. For example, register object 1614 inherits from the base register class (i) a high address field 1904, (ii) a low address field 1906, (ii) a register array length field 1908, (iv) a pointer 1916 to a device object, (v) and a pointer 1918 to a test object.

Figure 19B:
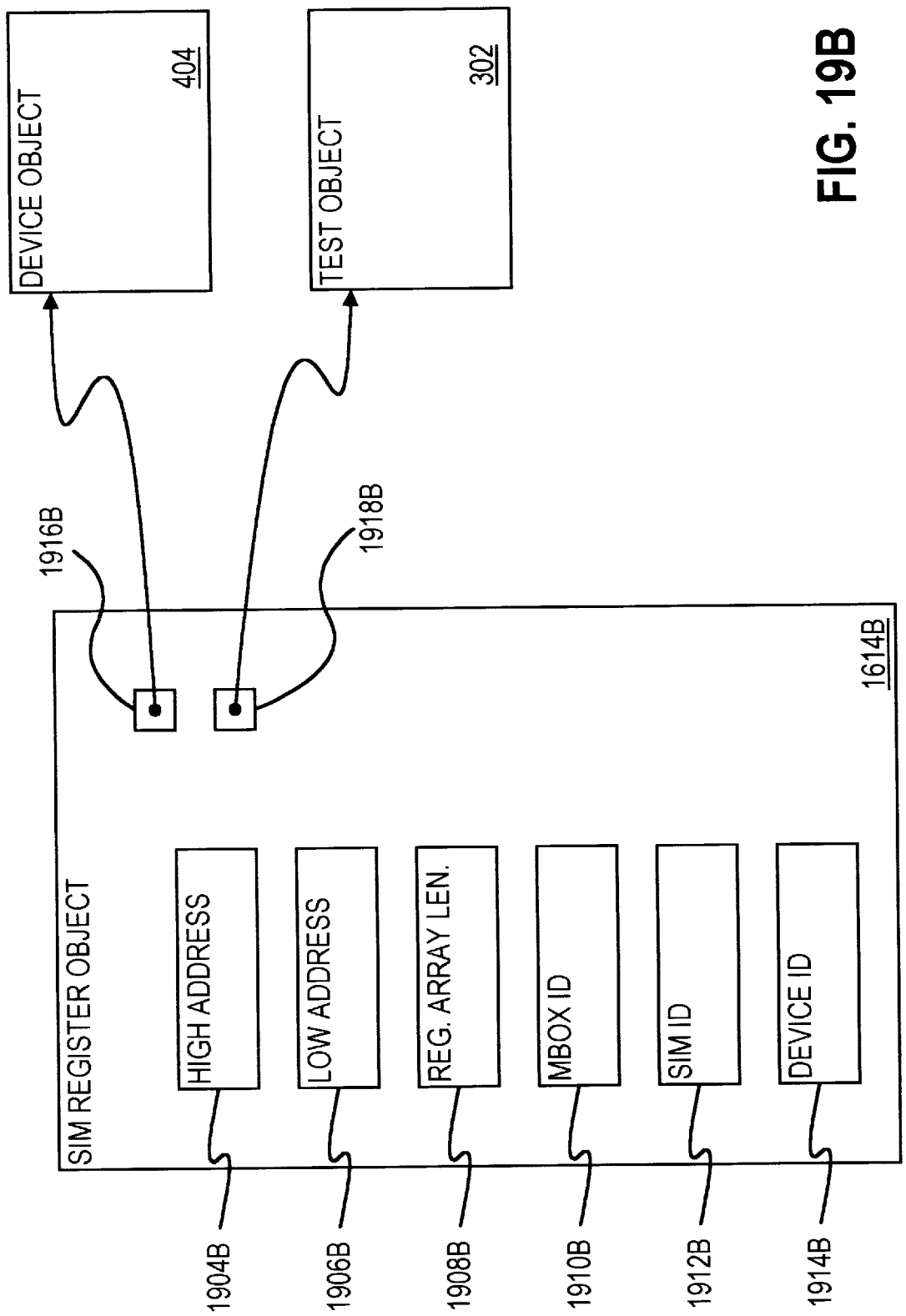

A register object represents a register address range. A simulation register object, e.g., simulation register object 1614, represents a register address range of a device of a simulation system of the simulation controlled through hub 130 (FIG. 1). High address field 1904 FIG. 19) and low address field 1906 contain data which represent the high and low limits, respectively, of the register address range represented by simulation register object 1614. Register array length field 1908 contains data which specifies the number of register addresses contain in the register address range specified by high address field 1904 and low address field 1906. Pointer 1916 identifies a device object, e.g., device object 404, which represents a device which in turn includes the one or more registers which have addresses included in the range of register addresses represented by simulation register object 1614. Pointer 1918 identifies a test object, e.g., test object 302, which includes device object 404.

Two subclasses of the base register class are defined in test framework 204 (FIG. 2), a simulation register class and a local register class. Thus, a device object can include a pointer to a register object and can direct the register object to store or retrieve data from a particular register address. As a result of polymorphism in object-oriented programming environments, the particular computer instructions executed in response to directing a register object to store or retrieve data from a register address is defined by the particular member function inherited by the register object and can be defined by the class of which the register object is an instance. For example, the local register class and the simulation register class each define member functions for reading data from and writing data to register addresses. If a register object is a local register object, the member functions of the local register class are executed. If a register object is a simulation register object, the member functions of the simulation register class are executed.

A simulation register object 1614B (FIG. 19B) is a member of the simulation register class and inherits attributes and member functions from the base register class and from the simulation register class. Simulation register object 1614B inherits from the base register class (i) a high address field 1904B, (ii) a low address field 1906B, (iii) a register array length field 1908B, (iv) a pointer 1916B to a device object, (v) and a pointer 1918B to a test object, which are directly analogous to (i) high address field 1904 (FIG. 19A), (ii) low address field 1906, (iii) register array length field 1908, (iv) pointer 1916, (v) and pointer 1918, respectively. Simulation register object 1614B inherits from the simulation register class (vi) a mailbox field 1910B, (vii) a simulation identification field 1912B, and (viii) a device identification field 1914B.

Mailbox field 1910B contains data identifying a mailbox through which data can be stored in and retrieved from a simulated register in the simulation system which simulates the one or more registers represented by simulation register object 1614B. Simulation identification field 1912B and device identification field 1914B are directly analogous to simulation identification field 1604 (FIG. 16) and device identification field 1606 and uniquely identify the device represented by device object 404. Simulation identification field 1912B (FIG. 19B) and device identification field 1914B therefore represent redundant information, but are included in simulation register 1614B for improved performance of test 120B (FIG. 1).

In creating simulation register object 1614B (FIG. 19B), data identifying a particular mailbox through which test 120B (FIG. 1) communicates with a simulation system, e.g., simulation system 140A. Mailboxes are described more completely in the Interface Application and that description is incorporated herein by reference. As defined by the creation member function defined by the simulation register class, the supplied data is stored in mailbox field 1910B FIG. 19B) in creating simulation register object 1614B.

Figure 19C:
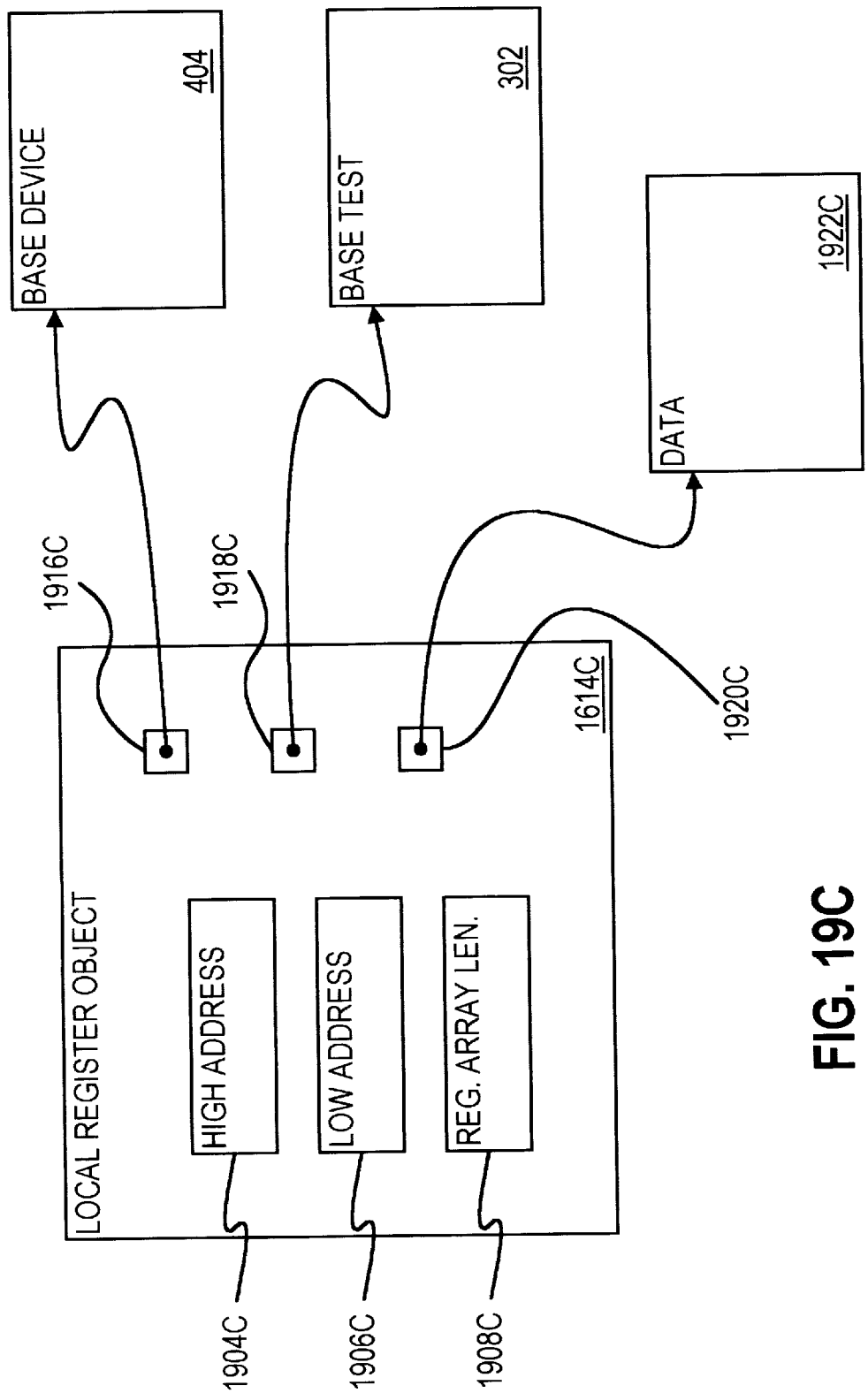
Figure 20:
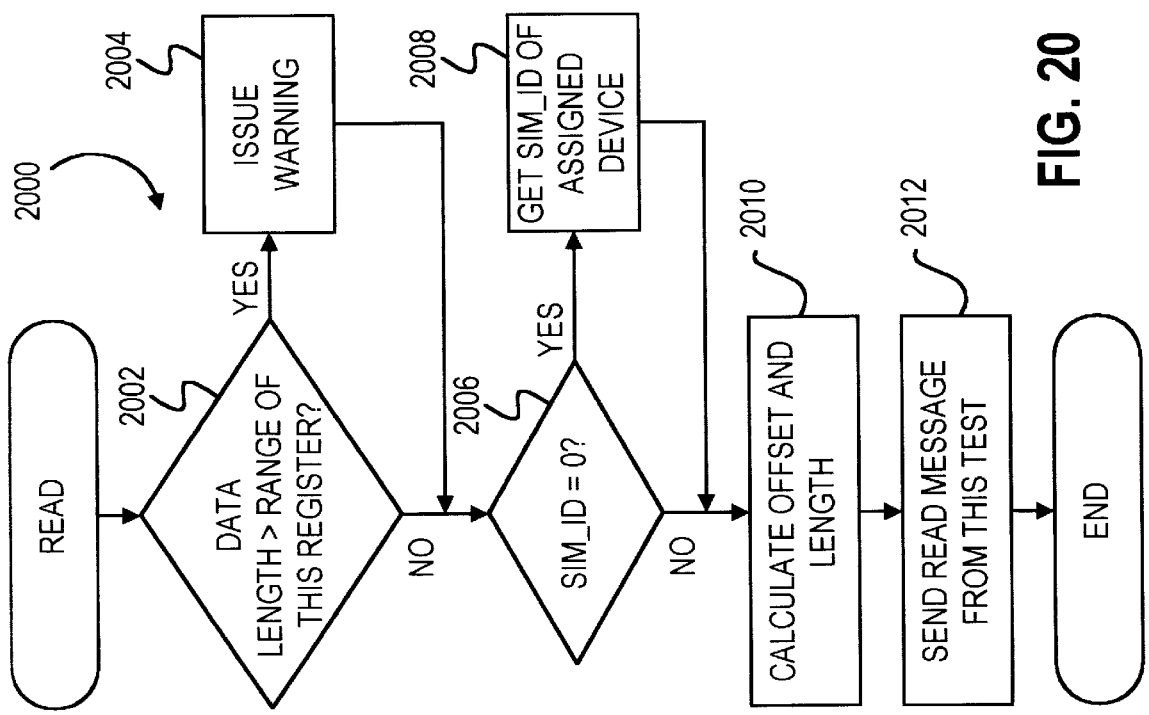

The simulation register class defines member functions by which data are stored in and retrieved from, respectively, a register of a simulation system, e.g., simulation system 140A. The read simulation register member function is illustrated by logic flow diagram 2000 (FIG. 20). In decision step 2002, the simulation register object performing the member function, e.g., simulation register object 1614 (FIG. 19), determines whether the length of data to be read is greater than the number of addresses in the range of register addresses represented by simulation register object 1614. If the length of data is greater than the size of the register address range represented by simulation register object 1614, a warning is issued in step 2004 and processing continues.

In decision step 2006, simulation register object 1614 (FIG. 19) determines whether data stored in simulation identification field 1912 is a valid simulation identifier. If simulation identification field 1912 does not contain a valid simulation identifier, simulation register object 1614 retrieves the simulation identifier represented in simulation identification field 1604 (FIG. 16) of device 404, which is the device object identified by pointer 1916 (FIG. 19) of simulation register object 1614 and stores the retrieved simulation identifier in simulation identification field 1912 in step 2008. Conversely, if simulation identification field 1912 contains a valid simulation identifier, simulation register object 1614 bypasses step 2008.

In step 2010, simulation register object 1614 determines the particular offset into the register address range represented by simulation register object 1614 from which to read in performing the simulation register read member function and determines length of data to read. In step 2012, simulation register object 1614 sends a read message to hub 130 using the read message member function described above with respect to FIG. 14 while specifying the mailbox identified by data stored in mailbox field 1910 as the mailbox from which to read and specifying the offset and length of data determined in step 2010. Thus, by merely specifying a register address and a length of data while directing a simulation register object, e.g., simulation register object 1614, to perform the simulation register read member function, a read message specifying the appropriate data to read is sent to hub 130 in accordance with the interface described in the Interface Application.

Figure 21:
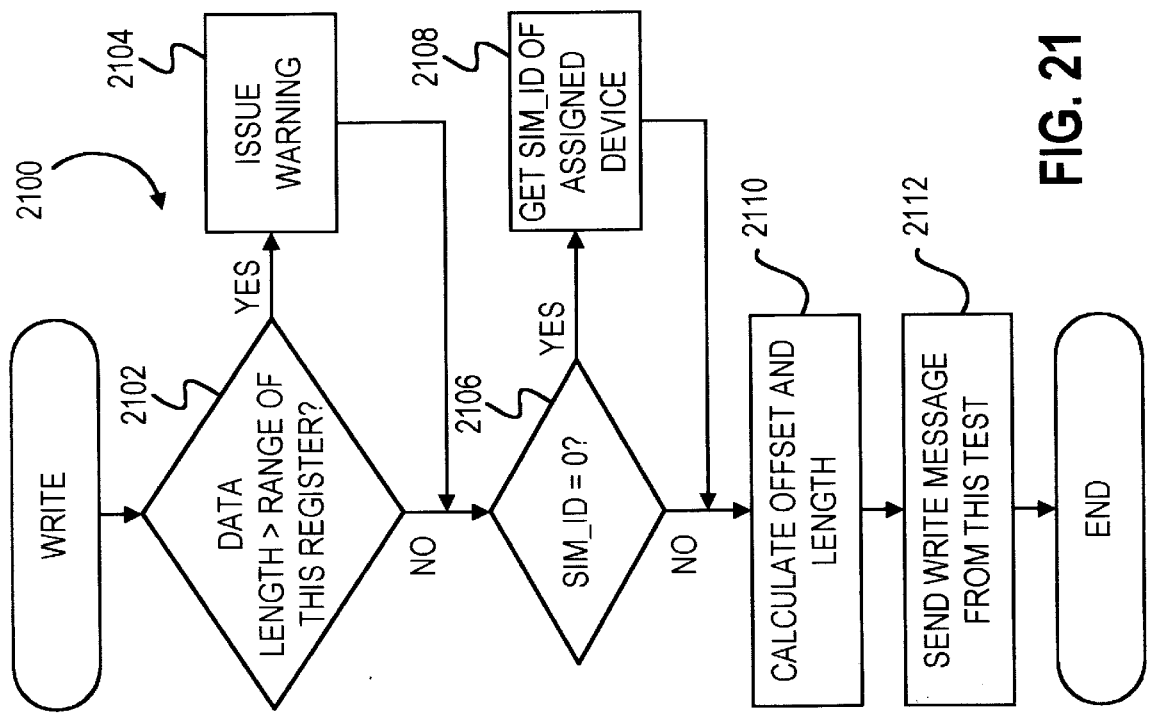
FIGS. 20 and 21 are logic flow diagrams of the processing of the register object of FIG. 19.

The write simulation register member function is illustrated by logic flow diagram 2100 (FIG. 21). In decision step 2102, the simulation register object performing the member function, e.g., simulation register object 1614 (FIG. 19), determines whether the length of data to be written is greater than the number of addresses in the range of register addresses represented by simulation register object 1614. If the length of data is greater than the size of the register address range represented by simulation register object 1614, a warning is issued in step 2104 and processing continues.

In decision step 2106, simulation register object 1614 (FIG. 19) determines whether data stored in simulation identification field 1912 is a valid simulation identifier. If simulation identification field 1912 does not contain a valid simulation identifier, simulation register object 1614 retrieves the simulation identifier represented in simulation identification field 1604 (FIG. 16) of device 404, which is the device object identified by pointer 1916 (FIG. 19) of simulation register object 1614 and stores the retrieved simulation identifier in simulation identification field 1912 in step 2108. Conversely, if simulation identification field 1912 contains a valid simulation identifier, simulation register object 1614 bypasses step 2108.

In step 2110, simulation register object 1614 determines the particular offset into the register address range represented by simulation register object 1614 to which to write in performing the simulation register write member function and determines length of data to write. In step 2112, simulation register object 1614 sends a read message to hub 130 using the load message member function described above with respect to FIG. 13 while specifying the mailbox identified by data stored in mailbox field 1910 as the mailbox to which to write and specifying the offset and length of data determined in step 2110. Thus, by merely specifying a register address and a length of data while directing a simulation register object, e.g., simulation register object 1614, to perform the simulation register write member function, a load message specifying the appropriate data to write is sent to hub 130 in accordance with the interface described in the Interface Application.

A local register object 1614C (FIG. 19C) is a member of the local register class and inherits attributes and member functions from the base register class and from the simulation register class. Simulation register object 1614C inherits from the base register class (i) a high address field 1904C, (ii) a low address field 1906C, (iii) a register array length field 1908C, (iv) a pointer 1916C to a device object, (v) and a pointer 1918C to a test object, which are directly analogous to (i) high address field 1904 (FIG. 19A), (ii) low address field 1906, (iii) register array length field 1908, (iv) pointer 1916, (v) and pointer 1918, respectively. Local register object 1614C inherits from the simulation register class (vi) a pointer 1920C to a data object 1922C in which data stored in registers represented by local register object 1614C.

The local register class defines member functions by which data is stored in or retrieved from register addresses. These member functions are similar to the member functions defined by the simulation register class as described above with respect to FIGS. 20 and 21 except that the storage of data and retrieval of data are implemented locally rather than through messages sent to a simulation system through test object 302 and hub 130 (FIG. 1). Specifically, step 2012 (FIG. 20) is replaced in the definition of a read register member function defined by the local register class with a step in which data identified by the offset and length determined in step 2010 are retrieved from data object 1922C (FIG. 19C). Similarly, step 2112 (FIG. 21) is replaced in the definition of a write register member function defined by the local register class with a step in which data identified by the offset and length determined in step 2010 are stored in data object 1922C (FIG. 19C).

Thus, a verification engineer can implement a register as a simulation register object which is at least partially realized in HDL in a simulation system or as a local register object which is realized entirely in an object-oriented programming environment and the distinction is undetectable by other objects, e.g., device objects, which interact with such register objects. The verification engineer can therefore move registers from one execution environment to the other without requiring adaptation of other components of test framework 204 (FIG. 2), e.g., of the base test class and the base device test.

The above description is illustrative only and is not limiting. The present invention is limited only by the claims which follow.

What is claimed is:

1. A method for testing a circuit design using one or more tests and one or more simulation systems, the method comprising the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems; and including within the test class a constructor member function which, when executed by the test object within a selected one of the one or more tests, establishes communication with a hub process wherein the hub process coordinates the testing of the circuit design by the one or more tests and one or more simulation systems.

2. The method of claim 1 further comprising the step of:

including within the test class a destructor member function which, when executed by the test object, terminates communication with the hub process.

3. A method for testing a circuit design using one or more tests and one or more simulation systems, the method comprising the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems; and including within the test class a destructor member function which, when executed by a test object of the test class within a selected one of the one or more tests, relinquishes reservation of one or more devices which are reserved to the selected test.

4. A method for testing a circuit design using one or more tests and one or more simulation systems, the method comprising the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems;

defining a device class which includes specification of one or more device member functions which can be performed by a device object, which is a member of the device class and which simulates a device of the circuit design, wherein one or more of the device object member functions implement the communication protocol through invocation of one or more of the test object member functions; and including within the device class a constructor member function which, when executed by the device object within a selected one of the one or more tests, reserves to the selected test the device of the circuit design simulated by the device object.

5. A method for testing a circuit design using one or more tests and one or more simulation systems, the method comprising the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems;

defining a device class which includes specification of one or more device member functions which can be performed by a device object, which is a member of the device class and which simulates a device of the circuit design, wherein one or more of the device object member functions implement the communication protocol through invocation of one or more of the test object member functions; and including within the device class a destructor member function which, when executed by the device object within a selected one of the one or more tests, relinquishes a reservation of the device of the circuit design simulated by the device object.

6. A computer readable medium useful in association with a computer which includes a processor and a memory, the computer readable medium including computer instructions which are configured to cause the computer to test a circuit design using one or more tests and one or more simulation systems by performing the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems; and including within the test class a constructor member function which, when executed by the test object within a selected one of the one or more tests, establishes communication with a hub process wherein the hub process coordinates the testing of the circuit design by the one or more tests and one or more simulation systems.

7. The computer readable medium of claim 6 wherein the computer instructions are figured configured to cause the computer to perform the step of:

including within the test class a destructor member function which, when executed by the test object, terminates communication with the hub process.

8. A computer readable medium useful in association with a computer which includes a processor and a memory, the computer readable medium including computer instructions which are configured to cause the computer to test a circuit design using one or more tests and one or more simulation systems by performing the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems; and including within the test class a destructor member function which, when executed by a test object of the test class within a selected one of the one or more tests, relinquishes reservation of one or more devices which are reserved to the selected test.

9. A computer readable medium useful in association with a computer which includes a processor and a memory, the computer readable medium including computer instructions which are configured to cause the computer to test a circuit design using one or more tests and one or more simulation systems by performing the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems;

defining a device class which includes specification of one or more device member functions which can be performed by a device object, which is a member of the device class and which simulates a device of the circuit design, wherein one or more of the device object member functions implement the communication protocol through invocation of one or more of the test object member functions; and including within the device class a constructor member function which, when executed by the device object within a selected one of the one or more tests, reserves to the selected test the device of the circuit design simulated by the device object.

10. A computer readable medium useful in association with a computer which includes a processor and a memory, the computer readable medium including computer instructions which are configured to cause the computer to test a circuit design using one or more tests and one or more simulation systems by performing the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems;

defining a device class which includes specification of one or more device member functions which can be performed by a device object, which is a member of the device class and which simulates a device of the circuit design, wherein one or more of the device object member functions implement the communication protocol through invocation of one or more of the test object member functions; and including within the device class a destructor member function which, when executed by the device object within a selected one of the one or more tests, relinquishes a reservation of the device of the circuit design simulated by the device object.

11. A computer system comprising:

a processor;

a memory operatively coupled to the processor; and a test builder which executes in the processor from the memory and which, when executed by the processor, causes the computer to test a circuit design using one or more tests and one or more simulation systems by performing the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems; and including within the test class a constructor member function which, when executed by the test object within a selected one of the one or more tests, establishes communication with a hub process wherein the hub process coordinates the testing of the circuit design by the one or more tests and one or more simulation systems.

12. The computer system of claim 11 wherein the test builder, when executed, further causes the computer to perform the step of:

including within the test class a destructor member function which, when executed by the test object, terminates communication with the hub process.

13. A computer system comprising:

a processor;

a memory operatively coupled to the processor; and a test builder which executes in the processor from the memory and which, when executed by the processor, causes the computer to test a circuit design using one or more tests and one or more simulation systems by performing the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems; and including within the test class a destructor member function which, when executed by a test object of the test class within a selected one of the one or more tests, relinquishes reservation of one or more devices which are reserved to the selected test.

14. A computer system comprising:

a processor;

a memory operatively coupled to the processor; and a test builder which executes in the processor from the memory and which, when executed by the processor causes the computer to test a circuit design using one or more tests and one or more simulation systems by performing the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems;

defining a device class which includes specification of one or more device member functions which can be performed by a device object, which is a member of the device class and which simulates a device of the circuit design, wherein one or more of the device object member functions implement the communication protocol through invocation of one or more of the test object member functions; and including within the device class a constructor member function which, when executed by the device object within a selected one of the one or more tests, reserves to the selected test the device of the circuit design simulated by the device object.

15. A computer system comprising:

a processor;

a memory operatively coupled to the processor; and a test builder which executes in the processor from the memory and which, when executed by the processor, causes the computer to test a circuit design using one or more tests and one or more simulation systems by performing the steps of:

configuring one or more of the tests in an object-oriented programming environment;

defining a test class which includes specification of one or more test object member functions which can be performed by a test object, which is a member of the test class, wherein one or more of the test object member functions implement a communication protocol through which the test object can interact with one or more of the simulation systems;

defining a device class which includes specification of one or more device member functions which can be performed by a device object, which is a member of the device class and which simulates a device of the circuit design, wherein one or more of the device object member functions implement the communication protocol through invocation of one or more of the test object member functions; and including within the device class a destructor member function which, when executed by the device object within a selected one of the one or more tests, relinquishes a reservation of the device of the circuit design simulated by the device object.

* * * * *